United States Patent [19]
Waku et al.

[11] Patent Number: 5,981,415
[45] Date of Patent: Nov. 9, 1999

[54] CERAMIC COMPOSITE MATERIAL AND POROUS CERAMIC MATERIAL

[75] Inventors: Yoshiharu Waku; Narihito Nakagawa, both of Ube; Kazutoshi Shimizu, Yamaguchi; Hideki Ohtsubo, Ube; Takumi Wakamoto, Ube; Yasuhiko Kohtoku, Ube, all of Japan

[73] Assignee: UBE Industries, Ltd., Ube, Japan

[21] Appl. No.: 08/885,568

[22] Filed: Jun. 30, 1997

[30]     Foreign Application Priority Data

Jul. 1, 1996 [JP] Japan ................................. 8-188041
Aug. 22, 1996 [JP] Japan ................................. 8-238640

[51] Int. Cl.$^6$ ........................... C04B 35/01; C04B 35/10; C04B 35/50
[52] U.S. Cl. ....................... 501/80; 501/127; 501/103; 501/108; 501/123; 501/133; 501/152; 501/153; 501/154; 501/126; 428/688; 428/700; 428/701; 428/702; 117/945; 117/947; 117/950
[58] Field of Search .......................... 501/80, 127, 152, 501/153, 126, 103, 108, 123, 133, 154; 428/688, 700, 701, 702; 51/309; 117/945, 947, 950

[56]                References Cited

U.S. PATENT DOCUMENTS

| | | | |
|---|---|---|---|
| 4,881,951 | 11/1989 | Wood et al. ........................ | 51/309 |
| 5,484,752 | 1/1996 | Waku et al. ........................ | 501/127 |
| 5,489,318 | 2/1996 | Erickson et al. ................... | 501/127 |
| 5,569,547 | 10/1996 | Waku et al. ....................... | 428/688 |

FOREIGN PATENT DOCUMENTS

| | | |
|---|---|---|
| 3-232779 | 10/1991 | Japan . |
| 4-31375 | 2/1992 | Japan . |
| 4-65372 | 3/1992 | Japan . |
| 7-149597 | 6/1995 | Japan . |
| 7-187893 | 7/1995 | Japan . |
| 8-81257 | 3/1996 | Japan . |

OTHER PUBLICATIONS

Jenn–Ming Yang et al., "Fracture Behavior of Directionally Solidified $Y_3Al_5O_{12}/Al_2O_3$ Eutectic Fiber," *J. Am. Ceram. Soc.*, vol. 79, No. 5, pp. 1218–1222 (1996). (no month).

*Primary Examiner*—Michael Marcheschi
*Attorney, Agent, or Firm*—Finnegan, Henderson, Farabow, Garrett & Dunner, L.L.P.

[57]                ABSTRACT

A ceramic composite material consisting of two or more crystal phases of different components, each crystal phase having a non-regular shape, said crystal phases having three dimensional continuous structures intertwined with each other, at least one crystal phase thereof being a single crystal. Further, by removing at least one crystal phase from this ceramic composite material, there is provided a porous ceramic material consisting of at least one crystal phase and pores, said crystal phase and pores having non-regular shapes and being three dimensionally continuous and intertwined with each other.

16 Claims, 27 Drawing Sheets

50μm

25μm

CERAMIC COMPOSITE MATERIAL AND POROUS CERAMIC MATERIAL

BACKGROUND OF THE INVENTION

1. Field of the Invention

The present invention relates to a ceramic composite material which has a high mechanical strength and an excellent thermal stability of the microstructure in a wide range of temperatures from room temperature to a high temperature so that it can be suitably used as a structural material and a functional material exposed to a high temperature; it also relates to a porous ceramic material which has a high mechanical strength and an excellent thermal stability of the microstructure in a wide range of temperature from room temperatures to a high temperature so that it can be suitably used as a structural material and, a filter material, a reinforcing material for a metal or ceramics, a catalyst carrier, a thermal insulating material and other functional materials to be exposed to a high temperature.

2. Description of the Related Art (I) SiC or $Si_3N_4$ has been investigated to develop ceramic materials to be used at high temperatures but is not sufficient in high temperature properties. As an alternative material thereof, SiC/SiC composite materials produced by chemical vapor deposition, provided by Societe Europeene de Propulsion, have attracted attention and, at present are considered to be the best high temperature structural materials, and have been investigated and developed. The temperature range at which they can be used is reported to be 1400° C. or lower.

A powder sintering method is the most popular method for producing ceramic materials. By improving the characteristics of powders, for example, by making the powder finer and purer, and controlling the conditions of sintering, a $ZrO_2$ ceramic material having a strength as high as 3.0 GPa at room temperature has been produced. Further, in the powder sintering method, nano-dispersion of foreign ceramic particles in a ceramic composite material has been made possible and improvements in the strength, toughness, thermal conductivity, thermal shock resistance and other properties of the ceramic material are being sought.

Generally, it has been considered that oxide ceramic materials are not suitable for high temperature structural materials since they are easily deformed at a high temperature. However, oxide ceramic materials have oxidation resistance and corrosion resistance superior to any other ceramics. Accordingly, if the mechanical properties of the oxide ceramic materials could be improved, the oxide ceramic materials could be used in a wide range of applications as high temperature materials. In this respect, metal oxides having a melting point higher than 2000° C., for example, $Al_2O_3$, $ZrO_2$, MgO, BaO, BeO, CaO, $Cr_2O_3$ and rare earth element oxides such as $Y_2O_3$, $La_2O_3$, $Yb_2O_3$, $Sm_2O_3$, $Gd_2O_3$, $Nd_2O_3$ and $Er_2O_3$ are considered to be good candidates as high temperature ceramics.

Japanese Unexamined Patent Publication (Kokai) No. 5-85821, published in 1993, discloses a sintered body comprising a rare earth element oxide (or oxides of a mixture of rare earth elements) and $Al_2O_3$ and a process for producing the same. In this process, a rare earth element oxide(s) and $Al_2O_3$ are mixed and formed into a shape, which is then sintered at an appropriate sintering temperature and for an appropriate sintering time period so as to control the crystal grain size of the shape to be less than 30 μm and prevent extraordinary grain growth and pores, to thereby provide a rare earth element oxide/alumina ceramic sintered body having a high strength and toughness which is reliable.

However, the room temperature strength may be significantly improved by controlling the production conditions and improving the starting powders, but the high temperature mechanical properties of ceramic composite materials are greatly influenced by the structure of the interface (grain boundary) between the particles of the component materials as well as by the interface (grain boundary) between and the crystal characteristics of the matrix and reinforcing phase. Further, at a high temperature, as the structure is finer, the more the superplastic property appears. Thus coexistence of the finer structure and the high temperature strength is difficult to attain.

Accordingly, a new method for producing a composite ceramic material which allows precise control of the above factors as well as a new composite ceramic material which has a novel structure and interface or grain boundary structure, are in demand.

The present inventors, considering the above problems of the prior art, have made investigation in order to provide a ceramic composite material which has unexpectedly improved high temperature properties.

As a result, the present inventors have invented novel composite materials, which consist of single crystal/single crystal, single crystal/polycrystal and polycrystal/polycrystal phases of an α-alumina phase and a YAG phase, as disclosed in Japanese Unexamined Patent Publication (Kokai) No. 7-149597 (published in 1995), 8-81257 (published in 1996) and 7-187893 (published in 1995).

The first purpose of the present invention is to provide, following the above composite materials consisting of an α-alumina phase and a YAG phase, novel ceramic composite materials, consisting of two or more crystals of different components or substances, the crystals having continuous three dimensional networks intertwined with each other, which composite material have excellent mechanical strength and structure thermal stability from room temperature to a high temperature, particularly greatly improved properties at a high temperature.

(II) In another aspect of the present invention, there is also provided novel porous ceramic materials, which are obtained from the above novel ceramic composite materials.

In comparison with metal and organic materials, the ceramics have such characteristics as (1) thermal characteristics of a high melting point, a small thermal expansion coefficient and a low thermal conduction, (2) mechanical properties of a high strength at high temperatures, a high hardness and a brittleness, and (3) electrical properties of a small electroconductivity, a large temperature dependency of electric resistance and a large dielectric constant. For example, $Al_2O_3$ is chemically stable and hard and has a relatively high strength and an excellent electrical insulation and, therefore, it is widely used in various applications including insulating materials, abrasives, cutting tool materials, IC circuit boards, laser emitting materials, catalyst carriers and biomaterials.

Production of ceramics is currently being done mainly by the powder sintering method and, as a result, pores are necessarily included in the produced ceramics in grater or lesser degree. The powder sintering method is characterized in that the porosity, pore diameter and pore size distribution may be controlled by the control of the particle size and particle size distribution of starting powders and pressing pressure for shaping.

The porous ceramics having a certain level of porosity may exhibit a low density, a high specific surface area and other functions resulting from the penetrating pores, in addition to the characteristics inherent to the material of the ceramics. For example, a thermal insulator, an adsorber, a filter and so on.

Recently, vigorous investigation has been made to utilize ceramics having excellent thermal resistance, chemical resistance and mechanical properties by improving the functions thereof to an extreme level. Among them, ceramic filters, due to their excellent thermal, mechanical and chemical properties, are used as filters not only for filtering high temperature gases, chemicals, food and corrosive liquids but also for removal of metal oxides from molten metals and collection and removal of radioactive wastes.

Conventional methods for producing porous ceramics include (1) a process comprising forming a ceramic powder composition with an inorganic or organic binder, the particle size distribution of which is controlled, followed by sintering, (2) a process comprising mixing a ceramic powder with a pore-forming agent such as a polymer powder, an organic fiber and a carbon powder, forming the composition into a shape, and heating the shape to burn the combustible material and produce a ceramic with pores remaining therein, (3) a process comprising impregnating a foamed polymer body with a ceramic slurry, followed by heat treating it to burn the foamed polymer, (4) a process comprising heat treating a molten glass comprising two phases soluble and insoluble to a reagent at a temperature to form the two phases, followed by dissolving the soluble phase to form pores, and so on. However, in order to precisely control the pore size and distribution, provision of a porous crystal in which the pore is a part of the crystal, is required.

Recent diversity of the technology in various industrial fields makes applications and required properties of porous materials diverse. Particularly required properties of porous materials are uniform distribution of pores with a uniform pore size distribution, and a high porosity and high mechanical strength. However, satisfactory high porosity and high mechanical strength are difficult to obtain by the conventional methods.

For example, a conventional sintered silicon carbide consists of coarse plate crystals with less bonding between the crystals and, therefore, the mechanical strength is extremely low and the plate crystals may be peeled or the filter is fractured by shaking during handling. A porous ceramics produced by the sintering method comprises a glass flux or a clay material as a binder to bond the respective ceramic particles and, therefore, the ceramic material has low thermal and chemical resistances and a low flexural strength of not more than about 200 kg/cm$^2$. Further, upon heating the binder is softened so that the porosity and pore size easily change and the mechanical strength may be significantly lowered as the bonding between the particles is weak. Moreover, a woven material and a felt- or block-like shape of a heat resistant inorganic fiber are used as a thermal insulator, a high temperature catalyst carrier, a filter, and a reinforcing member for various matrixes of resins, metals, glass and ceramics. However, since the bonding between the inorganic fibers is weak, the inorganic fibers may fly and disperse into the air (environment pollution problems), and since the mechanical strength is low, a honeycomb structure with a complex shape cannot be produced.

For example, Japanese Unexamined Patent Publication (Kokai) No. 3-232779 published in 1991 discloses a process for producing a porous silicon carbide sintered body excellent in an air permeability and mechanical properties. The starting silicon carbide particles used have a carbonaceous substance on the surface of the particles so that the grain growth of the silicon carbide is controlled to an appropriate level to form a porous body having a crystal structure in which relatively fine particulate crystals and relatively coarse plate-shape crystals co-exist and bonding between the crystals is increased. As a result, the mechanical strength is improved.

Japanese Unexamined Patent Publication (Kokai) No. 4-31375 published in 1992 discloses a process for producing a porous heat resistant member of a high purity mullite. A heat resistant inorganic fiber, an aluminum salt and a silicic acid sol are mixed and dispersed in water, and hydrolysis is conducted to form a co-precipitated sol of an aluminum silicate in the mixture. As a result, the heat resistant inorganic fiber and an aluminum silicate, which is highly active and excellent in sinterability, can be uniformly mixed and dispersed, so that a sheet-like shaped body with a high bonding between fibers can be obtained and the mechanical strength of the sheet is also improved. Therefore, it may be formed into a honeycomb.

Japanese Unexamined Patent Publication (Kokai) No. 4-65327 published in 1992 discloses a process for producing a high strength porous ceramics comprising a mullite whisker. It is described that the mullite whisker (1) contains less of gloss-forming alkali impurities, (2) is heat resistant and stable in shape in air up to about 1700° C., and (3) has a relatively low thermal expansion coefficient. When the whisker crystals are three dimensionally intertwined to each other in sintering, continuous voids are formed in the sintered body. Using the mullite whisker or needle crystal, a ceramic material having a high strength and excellent pore-related properties such as the porosity and pore distribution can be produced by a simple process such as a process in which only the whisker is formed into a shape, or it is first mixed with a combustible substance such as a polymer or carbon powder followed by burning the combustible substance in air. Particularly, only a needle-like mullite crystal having a length of 1 to 20 μm and a diameter of 0.1 to 3 μm is formed into a pipe or a honeycomb by a mold pressing or other method, followed by heating in air at 1500 to 1700° C. for 1 to 5 hours, by which it is mentioned that the porous property can be desirably controlled. Also, it is described that since the Al or Si component in the mullite inter-diffuses through the surface of respective crystals at 1500 to 1700° C., sintering is accelerated and a sintering agent is unnecessary, so that the strength of the porous body increases. The porosity and the pore size can be desirable controlled by the size and amount of the mixed combustible substance. As a result, the obtained porous body had a porosity of 24.5% and the flexural strength of the porous body was as high as 980 kg/cm$^2$ at 1700° C. The properties of the porous body hardly changed after heating at 1000 to 1650° C. for some tens of hours.

However, this means that the thermal stability of the porous body is only the level of some tens hours at 1650° C. at the most.

Thus, in the sintering method, although the room temperature strength may be significantly improved by controlling the production conditions or selecting the starting powders, the mechanical property of a ceramics at a high temperature is greatly influenced by the structure of the crystal grain boundary and the crystallographic property of the constituting materials and the mechanical property of a ceramics at a high temperature is not stable or excellent as long as it is produced by the sintering method.

Therefore, a novel method for producing a porous ceramic material which allows precise control of the above-mentioned factors, and a porous ceramic material having such a novel microstructure resulting therefrom, are desired.

The purpose of this second aspect of the present invention is to provide a porous ceramic material which has both an excellent mechanical strength and an excellent thermal stability of the microstructure from room temperature to high temperatures, particularly these properties which are significantly improved at high temperature.

SUMMARY OF THE INVENTION

Thus, in accordance with the first aspect of the present invention, there is provided a ceramic composite material consisting of two or more crystal phases of different components, each crystal phase having a non-regular shape, said crystal phases having three dimensional continuous structures intertwined with each other, at least one crystal phase thereof being a single crystal.

The two or more crystal phases of different components constituting the ceramic composite material may be those of a combination of an eutectic system. As a material for a high temperature structural member which can be used at 1400° C. or higher for a long time, ceramic composite materials composed of two or more oxides selected from the group consisting of metal oxides and complex oxides of two or more metals are preferable.

The metal oxides include aluminum oxide ($Al_2O_3$), zirconium oxide ($ZrO_2$), magnesium oxide (MgO), silicon oxide ($SiO_2$), titanium oxide ($TiO_2$), barium oxide (BaO), beryllium oxide (BeO), calcium oxide (CaO), chromium oxide ($Cr_2O_3$) and rare earth element oxides such as $La_2O_3$, $Y_2O_3$, $CeO_2$, $Pr_6O_{11}$, $Nd_2O_3$, $Sm_2O_3$, $Gd_2O_3$, $Eu_2O_3$, $Tb_4O_7$, $Dy_2O_3$, $Ho_2O_3$, $Er_2O_3$, $Tm_2O_3$, $Yb_2O_3$ and $Lu_2O_3$.

The complex oxides produced therefrom include the following:

$LaAlO_3$, $CeAlO_3$, $PrAlO_3$, $NdAlO_3$, $SmAlO_3$, $EuAlO_3$, $GdAlO_3$, $DyAlO_3$, $ErAlO_3$, $Yb_4Al_2O_9$, $Er_3Al_5O_{12}$, $11Al_2O_3 \cdot La_2O_3$, $11Al_2O_3 \cdot Nd_2O_3$, $3Dy_2O_3 \cdot Al_2O_3$, $2Dy_2O_3 \cdot Al_2O_3$, $11Al_2O_3 \cdot Pr_2O_3$, $EuAl_{11}O_{18}$, $2Gd_2O_3 \cdot Al_2O_3$, $11Al_2O_3 \cdot Sm_2O_3$, $Yb_3Al_5O_{12}$, $CeAl_{11}O_{18}$, $Er_4Al_2O_9$.

Preferably, the ceramic composite material has a total concentration of impurities in an amount of not more than 1000 ppm, more preferably not more than 700 ppm. In this case, the ceramic composite material may exhibit a plastic deformation after yielding under applied stress at high temperatures. Each impurity is preferably not more than 100 ppm.

The ceramic composite material of the first aspect of the present invention is characterized by a solidified body obtained by the unidirectional solidification method.

To obtain a preferable high purity ceramic composite material of the present invention, the zone melting method can be advantageously utilized in which a portion with accumulated impurities can be easily removed from the material to make the material purer. After the purification, the unidirectional solidification method may be conducted in accordance with the present invention as described above.

In accordance with the second aspect of the present invention, there is also provided a porous ceramic material consisting of at least one crystal phase and pores, said crystal phase and pores having non-regular shapes and being three dimensionally continuous and intertwined with each other.

The crystal phase can be a single crystal. In this embodiment, the mechanical strength and the microstructure of the porous ceramic material can be excellently thermally stable from room temperature to high temperature and the porous ceramic material can have those properties which are surprisingly improved at high temperature. All the crystal phases are preferably single crystals.

The at least one crystal constituting the porous ceramic material can be selected from the materials which are described above for the ceramic composite material of the first aspect of the present invention.

The porous ceramic material of the second aspect of the present invention can be produced by selectively removing at least one crystal from the ceramic composite material of the first aspect of the present invention. The removal of a selected crystal from the ceramic composite material can be conducted by selective dissolution.

DETAILED DESCRIPTIONS OF THE INVENTION

Ceramic Composite Material

The ceramic composite material of the present invention may be obtained by controlling the conditions of the unidirectional solidification and is a ceramic composite material consisting of two or more crystal phases of different components, each crystal phase having a non-regular shape, said crystal phases having three dimensional continuous structures intertwined with each other. Further, the fineness of the structure of the ceramic composite material may be desirably controlled and, by precisely controlling the production conditions, at least one crystal phase may be a single crystal and the ceramic composite material may have a uniform structure without colonies, grain boundaries or coarse grains.

Particularly, by repeating the zone melting method to reduce the total impurity concentration to not more than 1000 ppm, more preferably not more than 700 ppm, the ceramic composite material may exhibit a plastic deformation of 0.5% or more, more preferably 0.8% or more, upon yielding by flexural test or tensile test at high temperatures. Here, the plastic deformation means a deformation caused by moving the dislocation in the crystal, and is not a superplasticity of some hundreds of percent caused by the grain boundary sliding or particle rotation which appears in a fine polycrystal in which the crystal size is made fine to the submicron order.

Journal of American Ceramics Society 79[5]1218–1222 (1996) reported that with regard to the thermal stability of a $YAG/Al_2O_3$ eutectic fiber, upon keeping the fiber at 1460° C. in air for 100 hours, the microstructure of the eutectic fiber grows by about 3 to 4 times and the tensile strength of the fiber decreases to less than half. The reasons therefor mentioned include that impurities of Fe and Ca were detected at portions where the extraordinary crystal grain growth occurred. It is also clear from the photograph of the structure of the fiber in the above literature than the $YAG/Al_2O_3$ eutectic fiber is a polycrystal having colonies.

In contrast, although the ceramic composite material of the present invention comprises the same YAG and $Al_2O_3$ and the production method is the same solidification method as the above $YAG/Al_2O_3$ eutectic fiber, the ceramic composite material of the present invention exhibits an extremely excellent thermal stability in that upon keeping at 1700° C., which is 0.93 Tm (where Tm is the melting point of the composite material of 1820° C.), in air for 1000 hours, the respective crystal phases do not change. This clearly shows the advantage of the microstructure that a ceramic composite material consists of two or more crystal phases of different components, each crystal phase having a non-regular shape, said phases having three dimensional continuous structures intertwined with each other, as well as the advantage of the high purification.

The ceramic composite material of the present invention consists of two or more crystal phases of different components having three dimensional continuous structures intertwined with each other.

The respective crystal phases are constituted by different components. That is, the compositions of the respective crystal phases are different from each other and each crystal phase has only one composition throughout the phase. The crystal phase may be a single crystal or a polycrystal.

The size of the structure of respective crystal phases may be controlled by changing the cooling rate, one of the conditions of the unidirectional solidification, but it is typically 1 to 30 $\mu$m. Here, the size of the structure of a crystal phase is defined as the length of the short axis of the structure in the cross-section perpendicular to the direction of solidification. Also, the structure is defined as being uniform when colonies or pores are not present.

For example, when a combination of $Al_2O_3$ and $Gd_2O_3$ is used, since the eutectic crystal is formed at 78% by mole of $Al_2O_3$ and 22% by mole of $Gd_2O_3$, a ceramic composite material consisting of an $Al_2O_3$ phase and a $GdAlO_3$ phase, having a perovskite structure as a complex oxide of $Al_2O_3$ and $Gd_2O_3$, can be obtained. In the ceramic composite material of the present invention, the proportion between the $Al_2O_3$ and $GdAlO_3$ phases may be varied in a range of about 20 to 80% by volume of the $Al_2O_3$ phase and about 80 to 20% by volume of the $GdAlO_3$ phase, by controlling the proportion between the starting materials of the $Al_2O_3$ and $Gd_2O_3$ powders.

The other oxides having a perovskite structure include $LaAlO_3$, $CeAlO_3$, $PrAlO_3$, $NdAlO_3$, $NdAlO_3$, $SmAlO_3$, $EuAlO_3$ and $DyAlO_3$. When any of these oxides constitute the ceramic composite material of the present invention, the structure becomes finer and a ceramic composite material having a high mechanical strength from room temperature to a high temperature can be obtained.

When a combination of $Al_2O_3$ and $Y_2O_3$ is used, since the eutectic crystal is formed at 82% by mole of $Al_2O_3$ and 18% by mole of $Y_2O_3$, a ceramic composite material consisting of an $Al_2O_3$ phase and a $Y_3Al_5O_{12}$ phase, having a garnet structure as a complex oxide of $Al_2O_3$ and $Y_2O_3$, can be obtained. In the ceramic composite material of the present invention, the proportion between the $Al_2O_3$ and $Y_3Al_5O_{12}$ phases may be varied in a range of about 20 to 80% by volume of the $Al_2O_3$ phase and about 80 to 20% by volume of the $Y_3Al_5O_{12}$ phase, by controlling the proportion between the starting materials of the $Al_2O_3$ and $Y_2O_3$ powders. The other oxides having a garnet structure include $Y_3Al_5O_{12}$, $Er_3Al_5O_{12}$, $Dy_3Al_5O_{12}$ and $Yb_3Al_5O_{12}$. When any of these oxides constitutes the ceramic composite material of the present invention, a ceramic composite material having a high creep strength can be obtained. For example, when a combination of $Al_2O_3$ and $Er_2O_3$ is used, since the eutectic crystal is formed at 81.1% by mole of $Al_2O_3$ and 18.9% by mole of $Er_2O_3$, a ceramic composite material consisting of an $Al_2O_3$ phase and a $Er_3Al_5O_{12}$ phase, having a garnet structure as a complex oxide of $Al_2O_3$ and $Y_2O_3$, can be obtained.

The ceramic composite material of the present invention can be prepared by the following method.

First, two or more ceramic powders are mixed in such a ratio therebetween as to form a ceramic composite material having a desired composition. The mixing method is not particularly limited and may be either of dry mixing and wet mixing. The medium in the wet mixing is generally an alcohol such as methanol and ethanol. The mixed powder is then heated in a known furnace, for example, an arc melting furnace, to a temperature at which the starting powders are melted, for example, 1900 to 2000° C. in the case of $Al_2O_3$ and $Er_2O_3$.

The molten material is set in a crucible and subjected to a unidirectional solidification. Alternatively, the molten material may be once solidified and pulverized, and the pulverized material be then set in a crucible and subjected to a unidirectional solidification. Thus, the ceramic composite material of the present invention is produced.

As a further alternative method, the molten material may be cast in a crucible, which is heated to a predetermined temperature, and then cooled under the controlled condition while the cooling rate is controlled to obtain a solidified body.

Reduction of the impurity concentration can be done by zone melting, preferably repeated zone melting. A preferable purification method is that once a solidified body has been obtained by a unidirectional solidification in a crucible, the solidified body is then subjected to repeated zone melting. Of course, alternatively, the starting bar to be used in this repeated zone melting may be a sintered body. However, in the zone melting, since impurities may be accumulated in an end portion of the body, the body can be purified simply by removing that impurity accumulated portion and this purified material can be preferably used as the starting material in the unidirectional solidification.

During the melting and solidifying, the atmospheric pressure is usually not higher than 300 Torr, preferably not higher than $10^{-3}$ Torr. The speed of moving a crucible during the unidirectional solidification, that is, the rate of growing the ceramic composite material, is usually not more than 200° C./hr, preferably 1 to 160° C./hr, more preferably 10 to 140° C./hr. The actual speed of moving a crucible during the unidirectional solidification may be typically not more than 500 mm/hr, preferably 1 to 20 mm/hr.

The conditions other than the atmospheric pressure and the crucible moving speed may be the same as those of known methods.

If the above atmospheric pressure or crucible moving speed is outside the above range, it is difficult to grow a single crystal and to obtain a composite material having an excellent mechanical strength at a high temperature.

The apparatus for unidirectional solidification may be a known one. For example, in such apparatus, a crucible is disposed in a vertical cylindrical container and is movable in the vertical direction, an induction coil for heating is arranged around the central portion of the cylindrical container, and a vacuum pump is provided for evacuating the inside of the container.

The ceramic composite material of the present invention has unexpectedly improved high temperature strength and structure thermal stability and exhibits excellent properties at a temperature higher than 1500° C., preferably higher than 1600° C., in air, and therefore is highly useful as a member of a turbine blade of a jet engine or a power generating turbine and a jig for measuring high temperature characteristics of various high temperature materials, and so on.

Also, the ceramic composite material of the present invention may be useful in many applications in which oxide ceramics such as $Al_2O_3$ are in practice used. Such applications include high temperature materials such as heat exchange members, fusion furnace materials, nuclear furnace materials and fuel cell materials; abrasion resistant members, cutting tool members, corrosion resistant materials, superconducting members, magnetic refrigeration materials, insulating members, phosphor materials, X-ray sensitizers, laser emitting elements; dielectric elements, positive temperature coefficient materials (PTC), condensers, varistors and other electronic devices, optical lenses, catalyst carriers, and many other applications.

Porous Ceramic Material

The porous ceramic material of the present invention may be obtained by first obtaining a ceramic composite material of the first aspect of the present invention as described above and then selectively removing at least one crystal phase from the ceramic composite material to leave three dimensionally continuous pores where the at least one crystal phase is removed.

As described above, the ceramic composite material may be obtained by controlling the conditions of the unidirectional solidification and is a ceramic material in which crystal phases of different components having a non-regular shape are three dimensional continuous structures intertwined with each other. Further, the fineness of the structure of the ceramic composite material may be desirably controlled and, by precisely controlling the production conditions, at least one crystal phase may be a single crystal and the ceramic composite material may have a uniform structure without colonies, grain boundaries or coarse grains.

Particularly, the total impurity concentration of not more than 1000 ppm, more preferably not more than 700 ppm, is preferable, since the ceramic composite material may exhibit a plastic deformation of 0.5% or more, more preferably 0.8% or more, upon yielding by flexural test or tensile test at a high temperature, as described above.

From the ceramic composite material of the first aspect of the present invention, by removing at least one crystal phase constituting the composite material from the ceramic composite material, a porous ceramic material of the present invention can be obtained.

The method for removing at least one crystal phase is not particularly limited and may be a process of dissolving out a soluble component with a reagent to leave pores, or a process of reduction removal with a CO or other reducing gas, or any other method. For example, a ceramic composite material consisting of $\alpha$-$Al_2O_3$ and $GaAlO_3$, YAG or $Er_3Al_5O_{12}$ is immersed in an aqueous solution of a mixture of nitric and fluoric acids in a weight % ratio of 1:5, the $\alpha$-$Al_2O_3$ is selectively removed. After a certain time period, only a $GdAlO_3$, YAG or $Er_3Al_5O_{12}$ crystal having a three dimensional continuous network structure is obtained. As a result, by removing the $\alpha$-$Al_2O_3$, the same volume becomes a pore volume which is non-regular in size and shape and is three dimensionally continuous and has a network structure. By changing the conditions of immersion in the aqueous solution, such as a reagent, time, temperature and concentration, selective removal of either crystal is possible. Also a ceramic material having pores only in a portion from the surface to a cerain depth may be produced if desired. In this case, the resultant porous ceramic material may have a structure in that the inside of the material consists of two or more crystal phases, for example, a metal oxide and a complex oxide of two or more metals, and the surface layer consists of at least one crystal phase and pores.

The porous ceramic material of the present invention is excellent in mechanical strength and thermal stability from room temperature to high temperatures. Therefore, the porous ceramic material can be suitably used as structural materials, and various functional materials such as filters, reinforcing materials for metals or ceramics, catalyst carriers and thermal insulators.

BRIEF DESCRIPTION OF THE DRAWINGS

FIGS. 28A and 28B are SEM photographs showing the structure of the ceramic composite material in Example 7, in which FIG. 28B is an enlarged view of a portion in FIG. 28A;

FIGS. 29A and 29B are SEM photographs showing the structure of the ceramic composite material in Example 8, in which FIG. 29B is an enlarged view of a portion indicated by the arrow in FIG. 29A;

FIGS. 30A and 30B are SEM photographs showing the structure of the ceramic composite material in Example 9, in which FIG. 30B is an enlarged view of a portion indicated by the arrow in FIG. 30A;

FIGS. 32A and 32B are SEM photographs showing the structure of the ceramic composite material in Example 10, in which FIG. 32B is an enlarged view of a portion indicated by the arrow in FIG. 32A.

EXAMPLES

Example 1

An $\alpha\text{-Al}_2\text{O}_3$ powder and a $\text{Gd}_2\text{O}_3$ powder were mixed in a mol % ratio of 78.0/22.0, followed by wet ball milling in ethanol as a medium to form a slurry. The ethanol was removed from the slurry by a rotary evaporator.

The obtained mixed powder was charged in a molybdenum crucible set in a chamber, the atmospheric pressure in the chamber was kept to $10^{-5}$ Torr, and the crucible was heated to 1850 to 1950° C. by a high frequency coil to melt the mixed powder. The crucible was then lowered at such a rate that the cooling rate was 60° C./hr, while the atmospheric pressure in the chamber was kept to $10^{-5}$ Torr, by which the unidirectional solidification was conducted to obtain a solidified body.

The solidified body with a diameter of 10 mm and a height of 50 mm was removed from the molybdenum crucible and then subjected to the zone melting method using a halogen lamp as a light source with a lowering speed of the solidified body of 20 mm/hr and a rotation speed of 5 rpm.

After the zone melting, an upper portion of 5 mm length with concentrated impurities was removed from the resultant solidified body.

The obtained solidified body and the starting powders were subjected to ICP analysis. The results are shown in Table 1. The starting powders contained some impurities in the order of about 200 ppm but each of the impurity levels was lowered to 100 ppm or less after the repeated zone melting.

TABLE 1

| | Content (ppm) | |
|---|---|---|
| Compound | Starting powder | Solidified body |
| $Y_2O_3$ | 160 | 90 |
| $Sm_2O_3$ | 170 | 70 |
| $Eu_2O_3$ | 225 | 100 |
| $Tb_4O_7$ | 260 | 100 |
| $SiO_2$ | 180 | 90 |
| CaO | 170 | 70 |
| $Fe_2O_3$ | 175 | 75 |

The thus purified solidified body was charged in a molybdenum crucible with the atmospheric pressure of $10^{-5}$ Torr, and the crucible was heated to 1850 to 1950° C. by a high frequency coil to melt the charged material. The crucible was then lowered in such a rate that the molten material was cooled at a cooling rate of 60° C./hr, to obtain a solidified body by unidirectional solidification.

Figure 1:
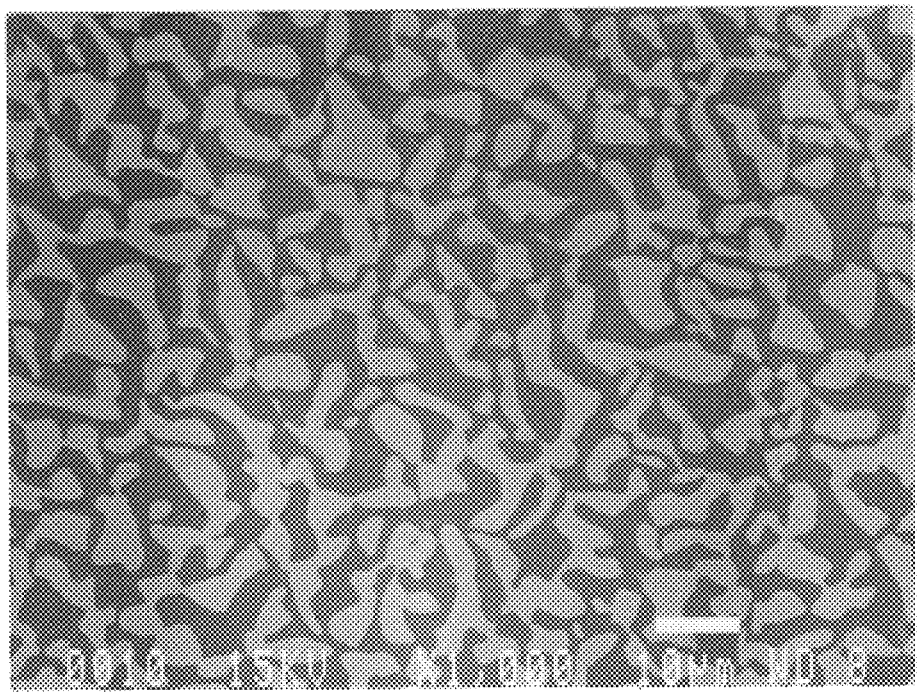
FIGS. 1 and 2 are SEM photographs showing of the structure of the ceramic composite material in Example 1.

FIG. 1 is an electron microscopic photograph of the microstructure in the cross-section perpendicular to the direction of solidification of the solidified body, in which the white portion is a $GdAlO_3$ phase and the black portion is an $\alpha\text{-Al}_2\text{O}_3$ phase. It was confirmed from FIG. 1 that the solidified body had a uniform structure having no colonies or grain boundaries and no pores or voids.

The X-ray diffraction of the cross-section of the solidified body perpendicular to the direction of solidification thereof was taken. As a result, only one diffraction peak from a specific plane of $\alpha\text{-Al}_2\text{O}_3$ and one diffraction peak from a specific plane of $GdAlO_3$ were observed and it was confirmed that the solidified body was a ceramic composite material consisting of an $\alpha\text{-Al}_2\text{O}_3$ single crystal and a $GdAlO_3$ single crystal.

Figure 2:
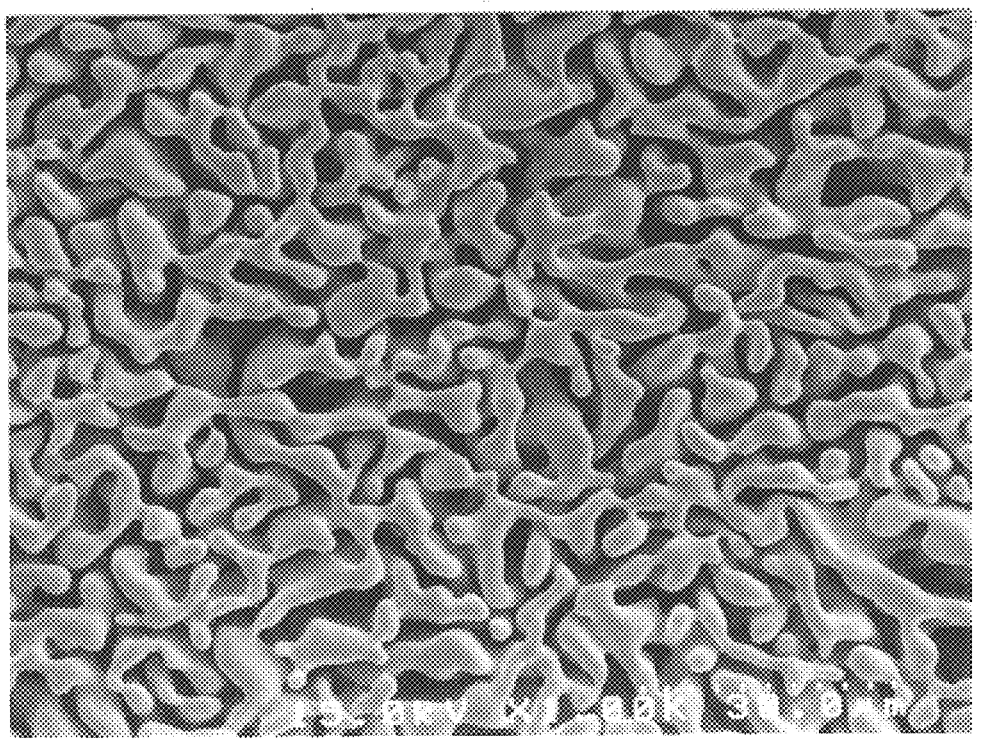

The solidified body was then immersed in an aqueous solution of nitric acid and fluoric acid in a weight % ratio of 1:5 to remove only the $\alpha\text{-Al}_2\text{O}_3$ phase. FIG. 2 shows an electron microscopic photograph of the thus obtained solidified body consisting only of the $GdAlO_3$ phase which was three dimensionally continuous.

From the above, it was confirmed that the solidified body was a ceramic composite material having a microstructure consisting of two phases of an $\alpha\text{-Al}_2\text{O}_3$ single crystal and a $CdAlO_3$ single crystal which were three dimensionally continuous and intertwined with each other.

Table 2 shows the mechanical strength of the ceramic composite material. The mechanical strength shown in Table 2 is the value measured by the three point flexural test at 1600° C. in air.

Figure 3:
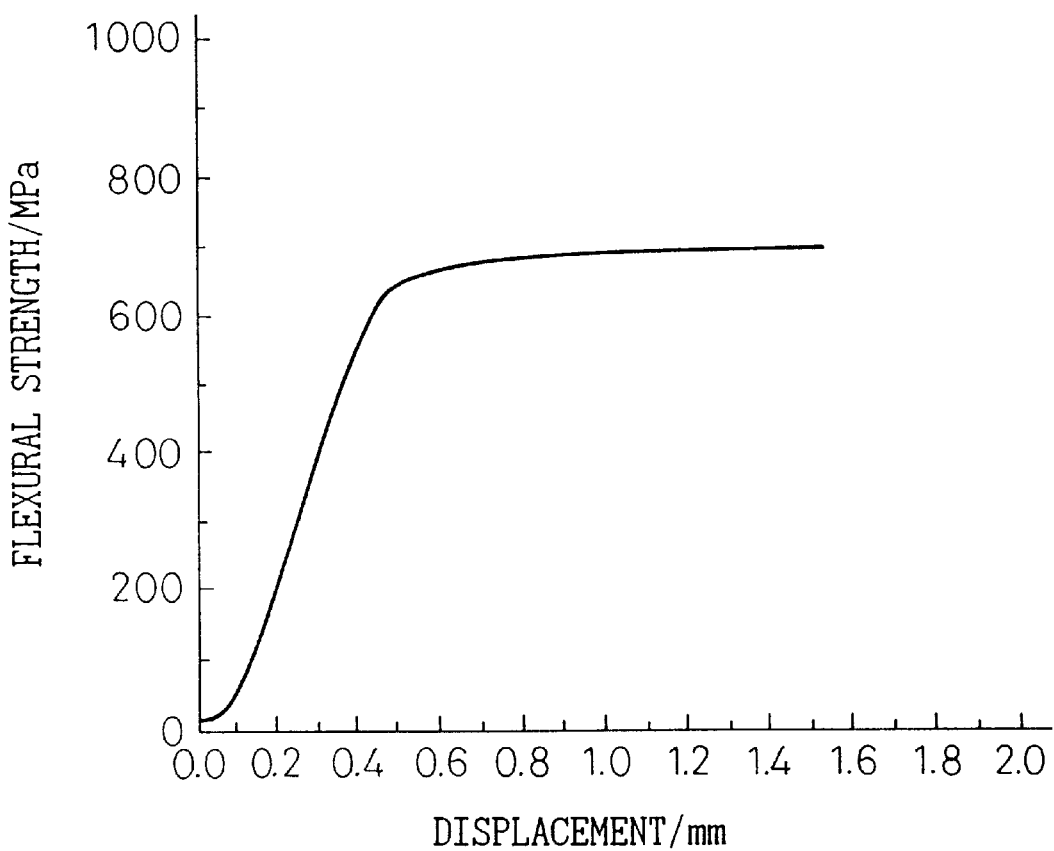
FIG. 3 is the stress-deformation curve in tensile test of the ceramic composite material in Example 1.

FIG. 3 shows the displacement curve of the flexural test in the longitudinal direction at 1600° C. FIG. 3 shows that the composite material exhibited a high yield of 700 MPa and upon yield it was not fractured but exhibited a plastic deformation.

Figure 4:
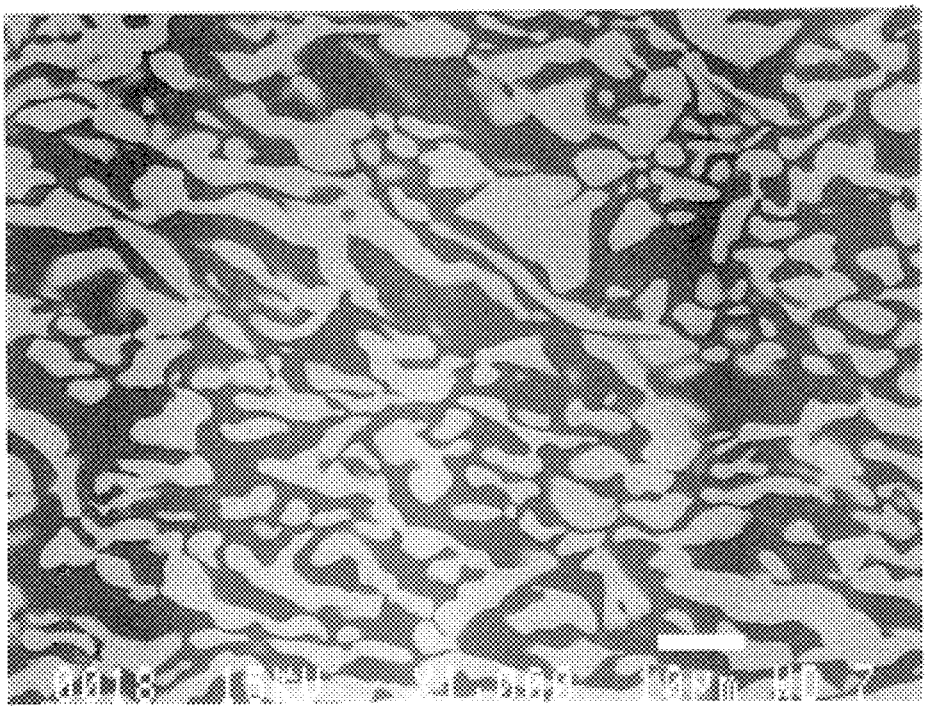
FIG. 4 is a SEM photograph showing the structure of the ceramic composite material before the flexural test in Example 1.
Figure 5:
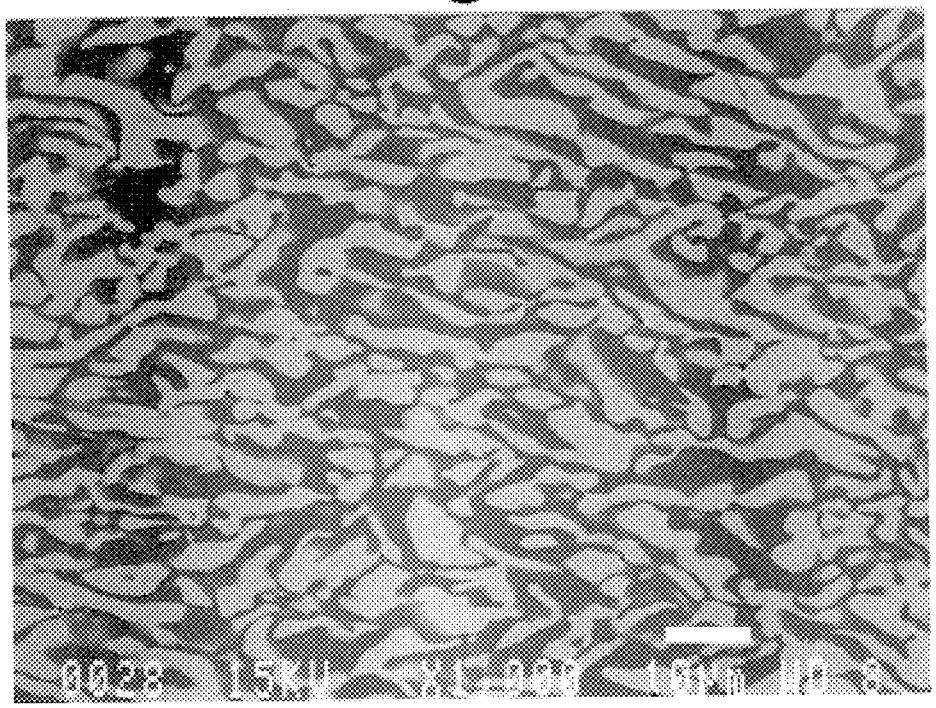
FIG. 5 is a SEM photograph showing the structure of the ceramic composite material after the flexural test in Example 1.

FIG. 4 shows an electron microscopic photograph of the microstructure of the solidified body before the flexural test and FIG. 5 shows that after the flexural test at 1600° C. The photographs show that the $\alpha\text{-Al}_2\text{O}_3$ and $GdAlO_3$ phases were plastically deformed.

TABLE 2

| Example No. | Bending strength at 1600° C. (MPa) |
|---|---|
| Example 1 | 700 |
| Com. Ex. 1 | 600 |
| Com. Ex. 2 | 650 |

Comparative Example 1

An $\alpha\text{-Al}_2\text{O}_3$ powder and a $\text{Gd}_2\text{O}_3$ powder were mixed in a ratio of 78.0/22.0 by mol %, followed by wet ball milling in ethanol as a medium to form a slurry. The ethanol was removed from the slurry by a rotary evaporator.

The obtained mixed powder was charged in a molybdenum crucible set in a chamber, the atmospheric pressure in the chamber was kept to $10^{-5}$ Torr, and the crucible was heated to 1850 to 1950° C. by a high frequency coil to melt the mixed powder. The crucible was then lowered at such a rate that the cooling rate was 300° C./hr, while the atmospheric pressure in the chamber was kept to Torr, by which the unidirectional solidification was conducted to obtain a solidified body.

Figure 6:
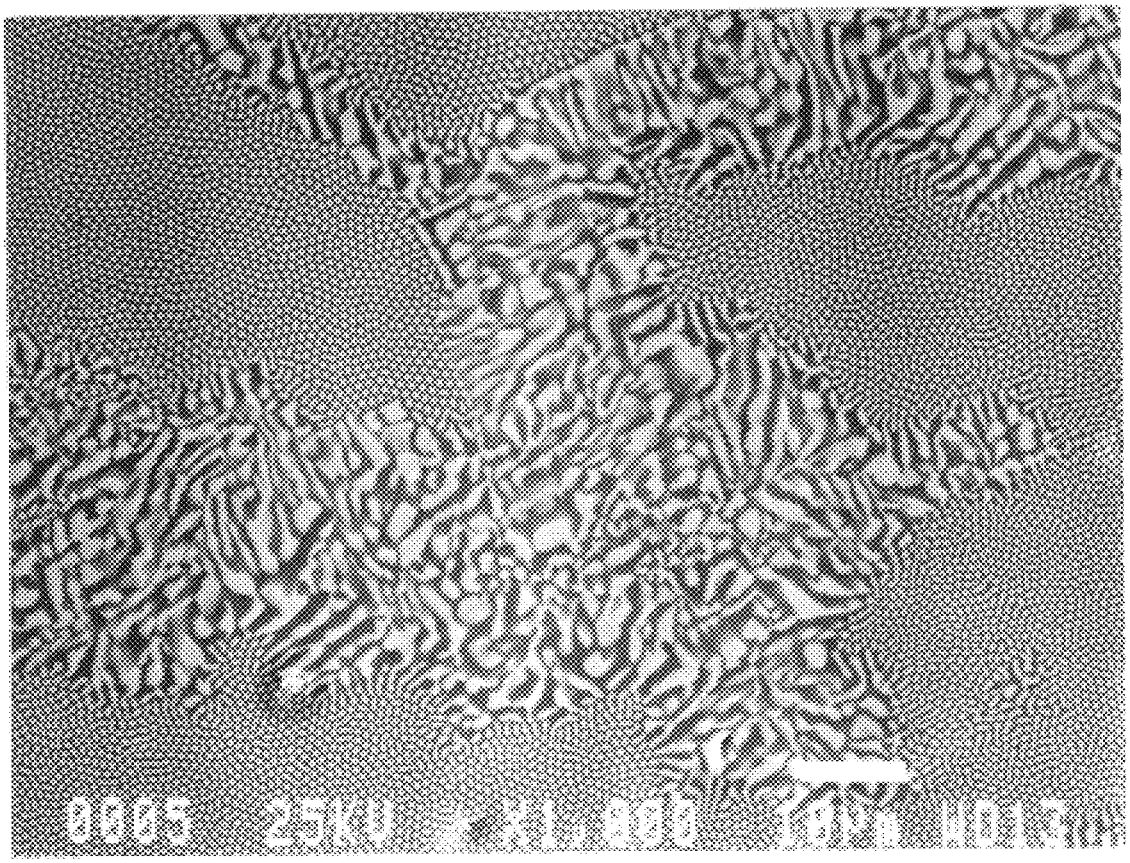
FIG. 6 is a SEM photograph showing the structure of the ceramic composite material in Comparative Example 1.

FIG. 6 is an electron microscopic photograph of the microstructure in the cross-section perpendicular to the direction of solidification of the solidified body, in which the white portion is a $GdAlO_3$ phase and the black portion is an Al$_2$O$_3$ phase. It was confirmed from FIG. 6 that the solidified body had a non-uniform structure having colonies and grain boundaries.

The X-ray diffraction of the cross-section of the solidified body perpendicular to the direction of solidification thereof was taken. As a result, diffraction peaks from a plurality of planes of α-Al$_2$O$_3$ and diffraction peaks from a plurality of planes of GdAlO$_3$ were observed and it was confirmed that the solidified body was a ceramic composite material consisting of two phases of an α-Al$_2$O$_3$ polycrystal and a GdAlO$_3$ polycrystal.

Table 2 shows the mechanical strength of this ceramic composite material. The mechanical strength shown in Table 2 is the value measured by the three point flexural test at 1600° C. in air.

Figure 7:
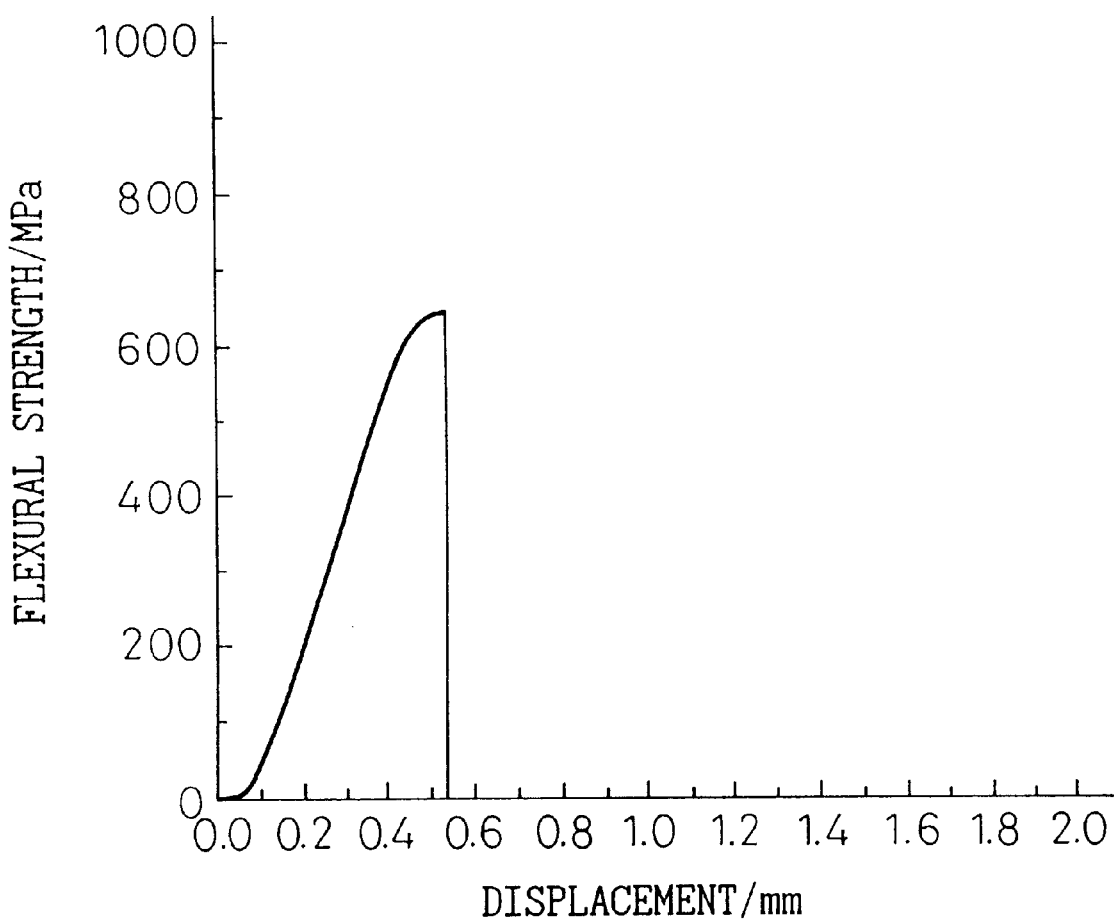
FIG. 7 is the stress-deformation curve in flexural test of the ceramic composite material in Comparative Example 1.

FIG. 7 shows the stress-deformation curve of the flexural test at 1600° C. FIG. 7 shows that the composite material exhibited a high yield of 600 MPa but upon yield it was fractured without plastic deformation.

Comparative Example 2

The procedures of Example 1 were repeated but the purification treatment by the zone melting method was not conducted and the crucible was lowered in such a rate that the cooling rate was 60° C./hr, while the atmospheric pressure in the chamber was kept to 10$^{-5}$ Torr, by which the unidirectional solidification was conducted to obtain a solidified body.

Figure 8:
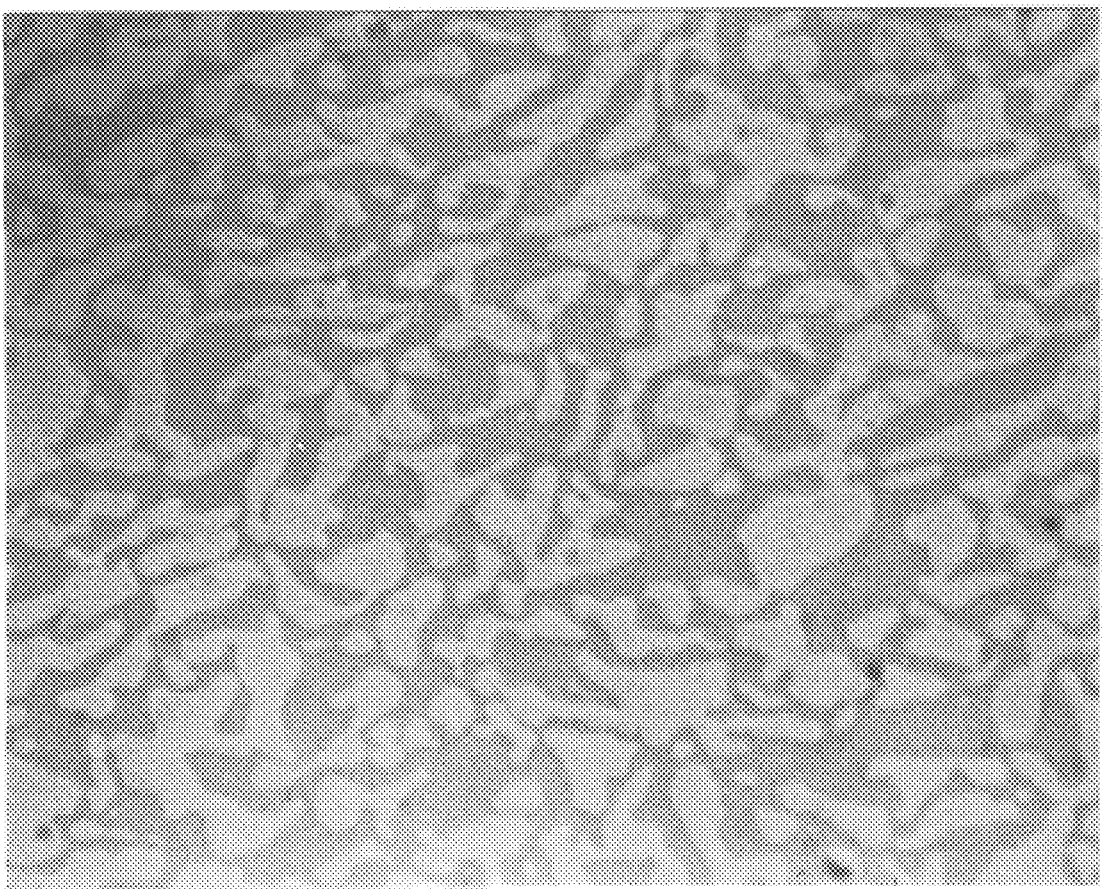
FIG. 8 is a SEM photograph showing of the structure of the ceramic composite material in Comparative Example 2.

FIG. 8 is an electron microscopic photograph of the microstructure in the cross-section perpendicular to the direction of solidification of the solidified body, in which the white portion is a GdAlO$_3$ phase and the black portion is an Al$_2$O$_3$ phase. It was confirmed from FIG. 8 that the solidified body had a uniform structure having no colonies or grain boundaries and no pores or voids.

The X-ray diffraction of the cross-section of the solidified body perpendicular to the direction of solidification thereof was taken. As a result, only one diffraction peak from a specific plane of α-Al$_2$O$_3$ and one diffraction peak from a specific plane of GdAlO$_3$ were observed and it was confirmed that the solidified body was a ceramic composite material consisting of two phases of an α-Al$_2$O$_3$ single crystal and a GdAlO$_3$ single crystal.

Table 2 shows the mechanical strength of this ceramic composite material. The mechanical strength shown in Table 2 is the value measured by the three point flexural test at 1600° C. in air.

Figure 9:
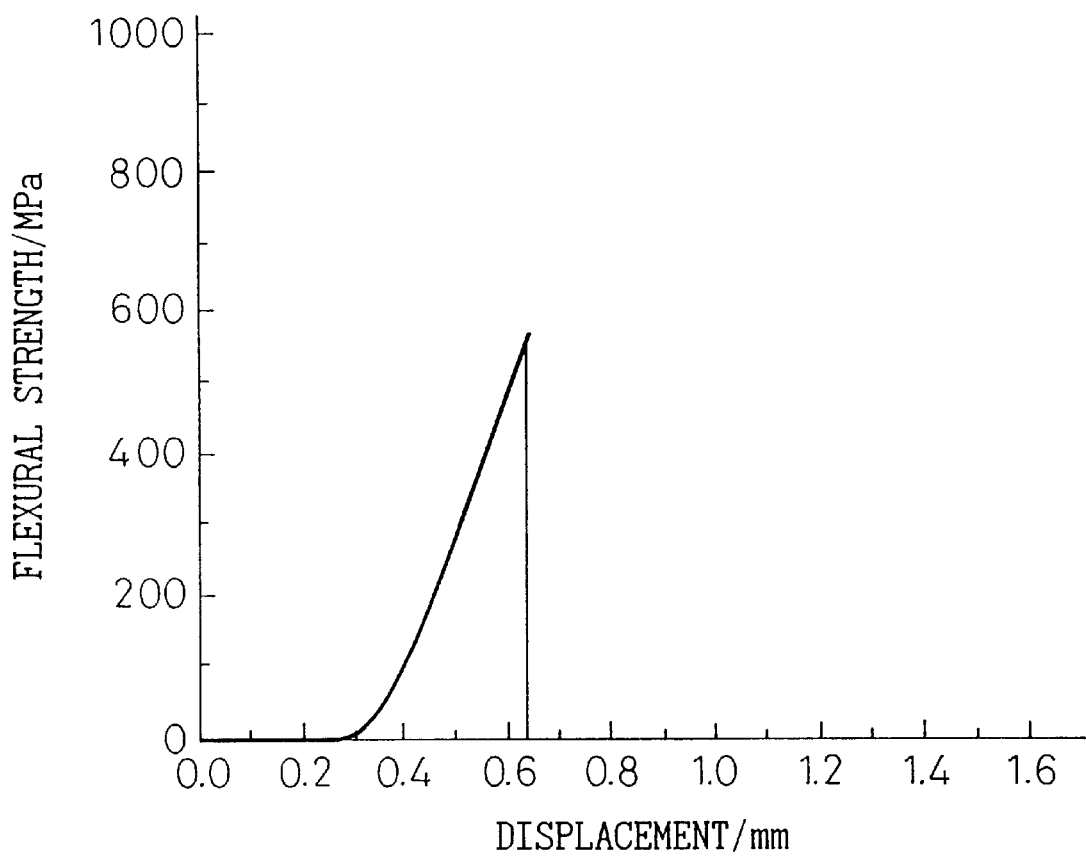
FIG. 9 is the stress-deformation curve in flexural test of the ceramic composite material in Comparative Example 2.

FIG. 9 shows the stress-deformation curve of the flexural test at 1600° C. FIG. 9 shows that the composite material exhibited a high yield of 650 MPa but brittle fracture occurred as can be seen in the curve of FIG. 9.

Example 2

The procedures of Example 1 were repeated but the cooling rate was 100° C./hr, by which a solidified body was obtained.

Figure 10:
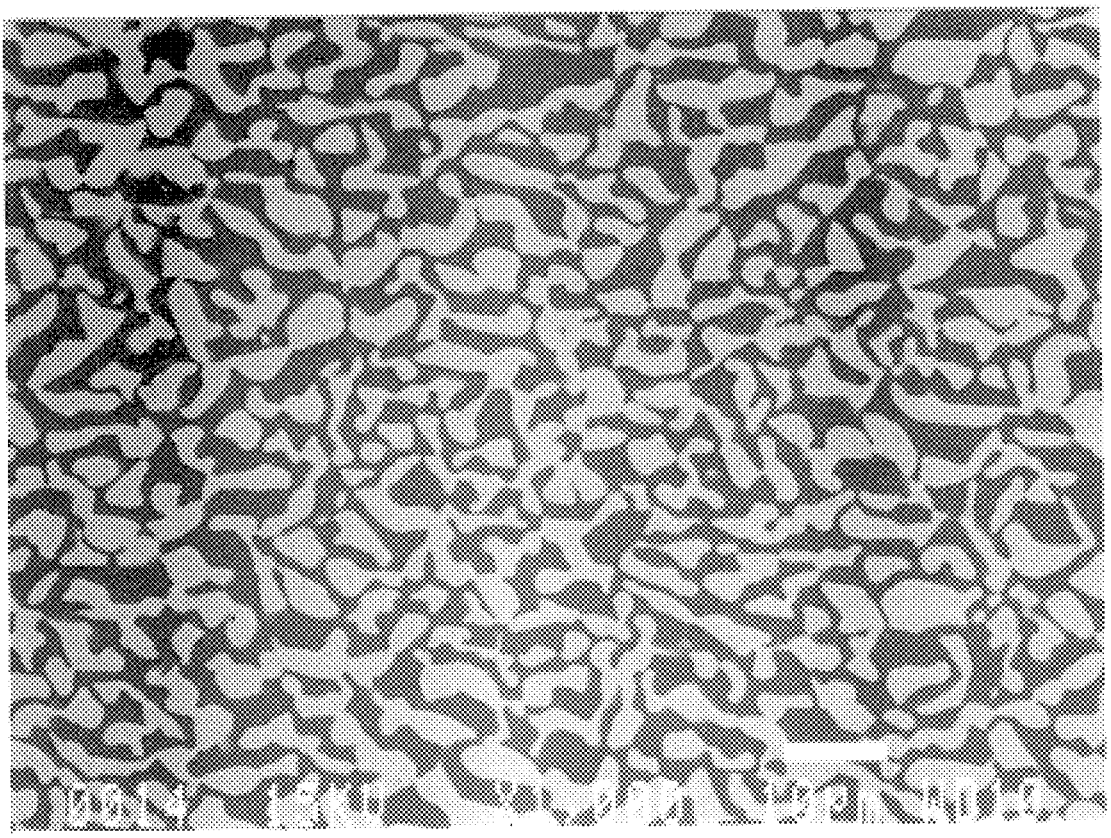
FIG. 10 is a SEM photograph showing of the structure of the ceramic composite material in Example 2.

FIG. 10 is a SEM photograph of the microstructure in the cross-section perpendicular to the direction of solidification of the solidified body, in which the white portion is a GdAlO$_3$ phase and the black portion is an Al$_2$O$_3$ phase. It was confirmed from FIG. 8 that the solidified body had a uniform structure having no colonies or grain boundaries and no pores or voids.

The X-ray diffraction of the cross-section of the solidified body perpendicular to the direction of solidification thereof was taken. As a result, one diffraction peak from a specific plane of α-Al$_2$O$_3$ and diffraction peaks from a plurality of planes of GdAlO$_3$ were observed and it was confirmed that the solidified body was a ceramic composite material consisting of two phases of an α-Al$_2$O$_3$ single crystal and a GdAlO$_3$ polycrystal.

Table 3 shows the mechanical strength of this ceramic composite material. The mechanical strength shown in Table 3 is the value measured by the three point flexural test at 1650° C. in air.

Figure 11:
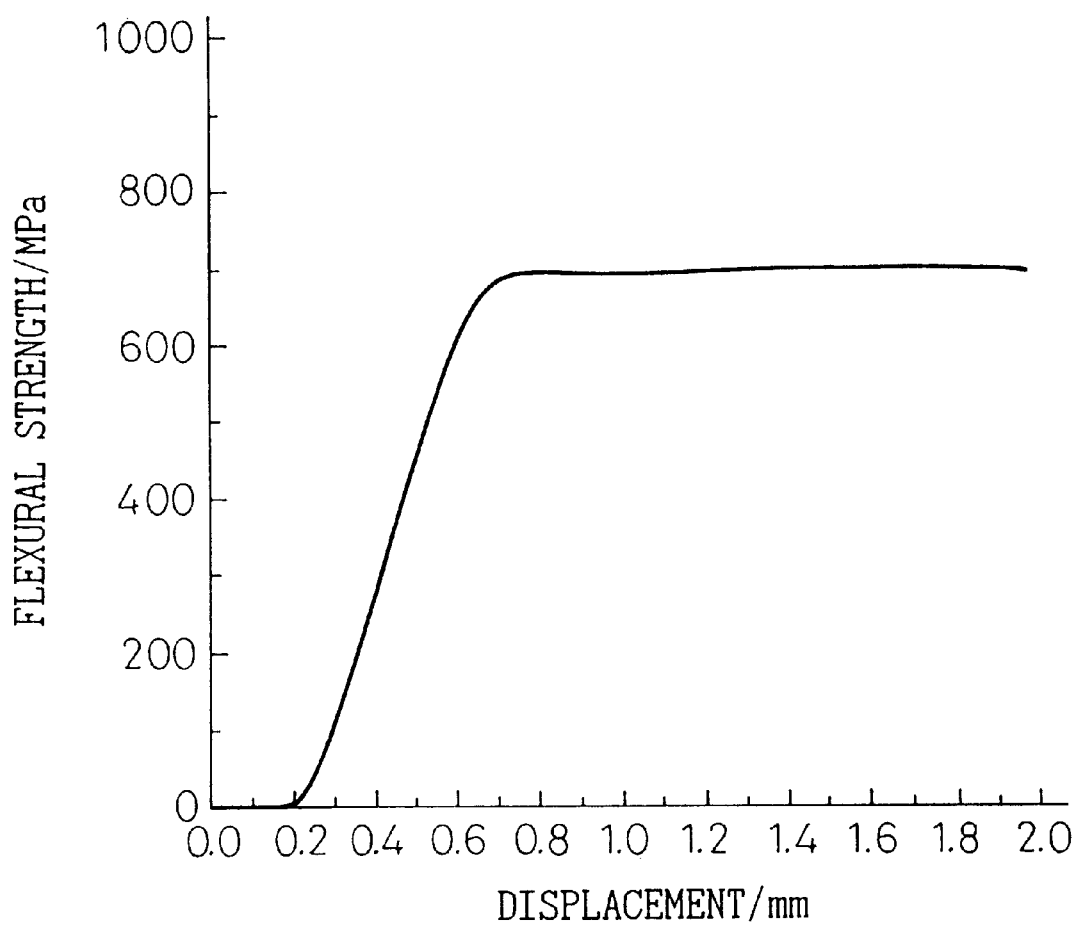
FIG. 11 is the stress-deformation curve in flexural test of the ceramic composite material in Example 2.

FIG. 11 shows the stress-deformation curve of the flexural test at 1650° C. FIG. 11 shows that the composite material exhibited a high yield of about 700 MPa and upon yield it was not fractured but exhibited a plastic deformation.

TABLE 3

| Example No. | Flexural strength at 1650° C. (MPa) |
| --- | --- |
| Example 2 | 700 |
| Example 3 | 780 |
| Com. Ex. 3 | 580 |

Example 3

The procedures of Example 1 were repeated but the cooling rate was 140° C./hr, by which a solidified body was obtained.

Figure 12:
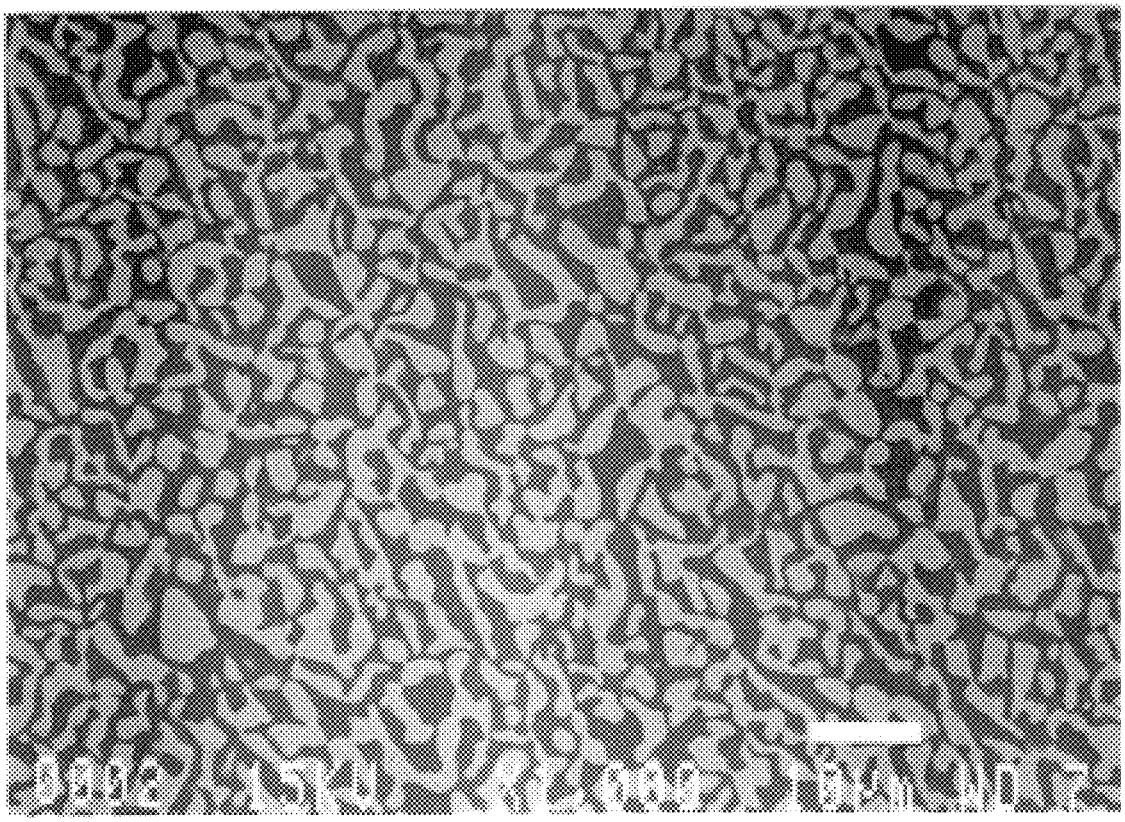
FIG. 12 is a SEM photograph showing the structure of the ceramic composite material in Example 3.

FIG. 12 is an electron microscopic photograph of the microstructure in the cross-section perpendicular to the direction of solidification of the solidified body, in which the white portion is a GdAlO$_3$ phase and the black portion is an Al$_2$O$_3$ phase. It was confirmed from FIG. 8 that the solidified body had a uniform structure having no colonies or grain boundaries and no pores or voids.

The X-ray diffraction of the cross-section of the solidified body perpendicular to the direction of solidification thereof was taken. As a result, one diffraction peak from a specific plane of α-Al$_2$O$_3$ and diffraction peaks from a plurality of planes of GdAlO$_3$ were observed and it was confirmed that the solidified body was a ceramic composite material consisting of two phases of an α-Al$_2$O$_3$ single crystal and a GdAlO$_3$ polycrystal.

Table 3 shows the mechanical strength of this ceramic composite material. The mechanical strength shown in Table 3 is the value measured by the three point flexural test at 1650° C. in air.

Figure 13:
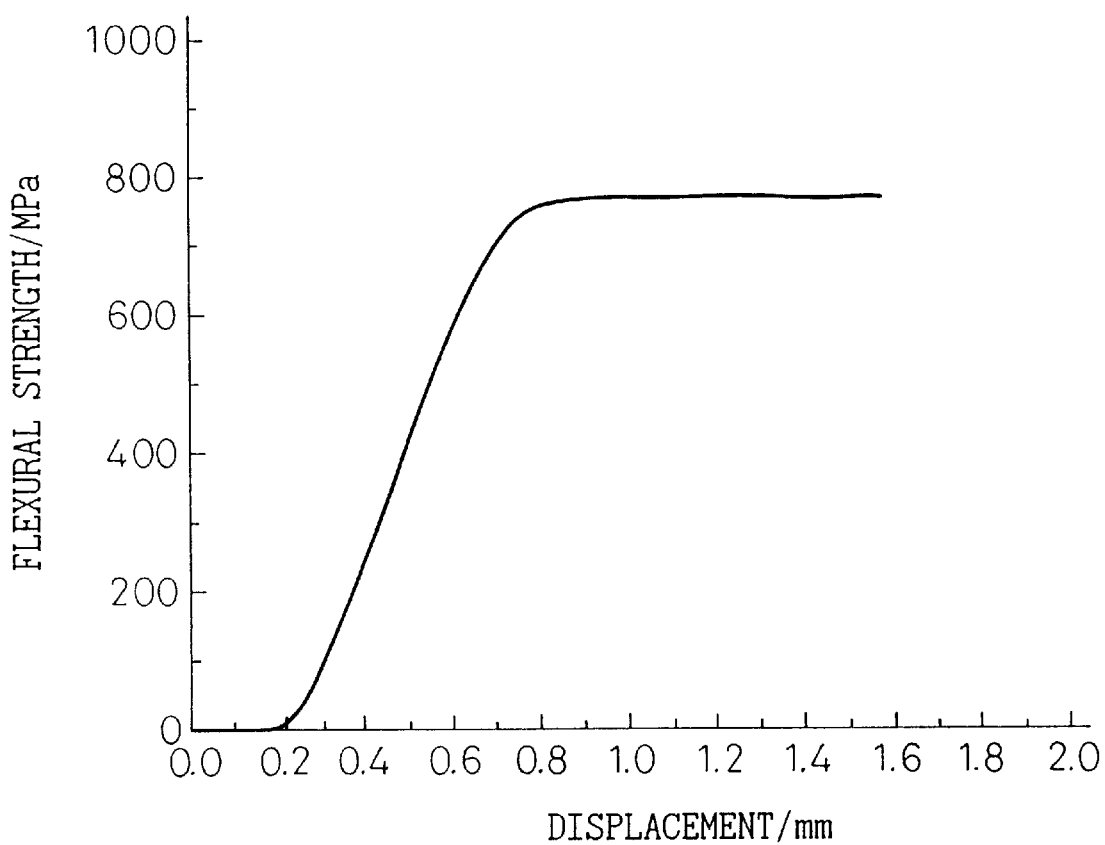
FIG. 13 is the stress-deformation curve in flexural test of the ceramic composite material in Example 3.

FIG. 13 shows the stress-deformation curve of the flexural test at 1650° C. FIG. 13 shows that the composite material exhibited a high yield of about 780 MPa and upon yielding it was not fractured but exhibited a plastic deformation.

Comparative Example 3

The procedures of Example 1 were repeated but the cooling rate was 180° C./hr, by which a solidified body was obtained.

Figure 14:
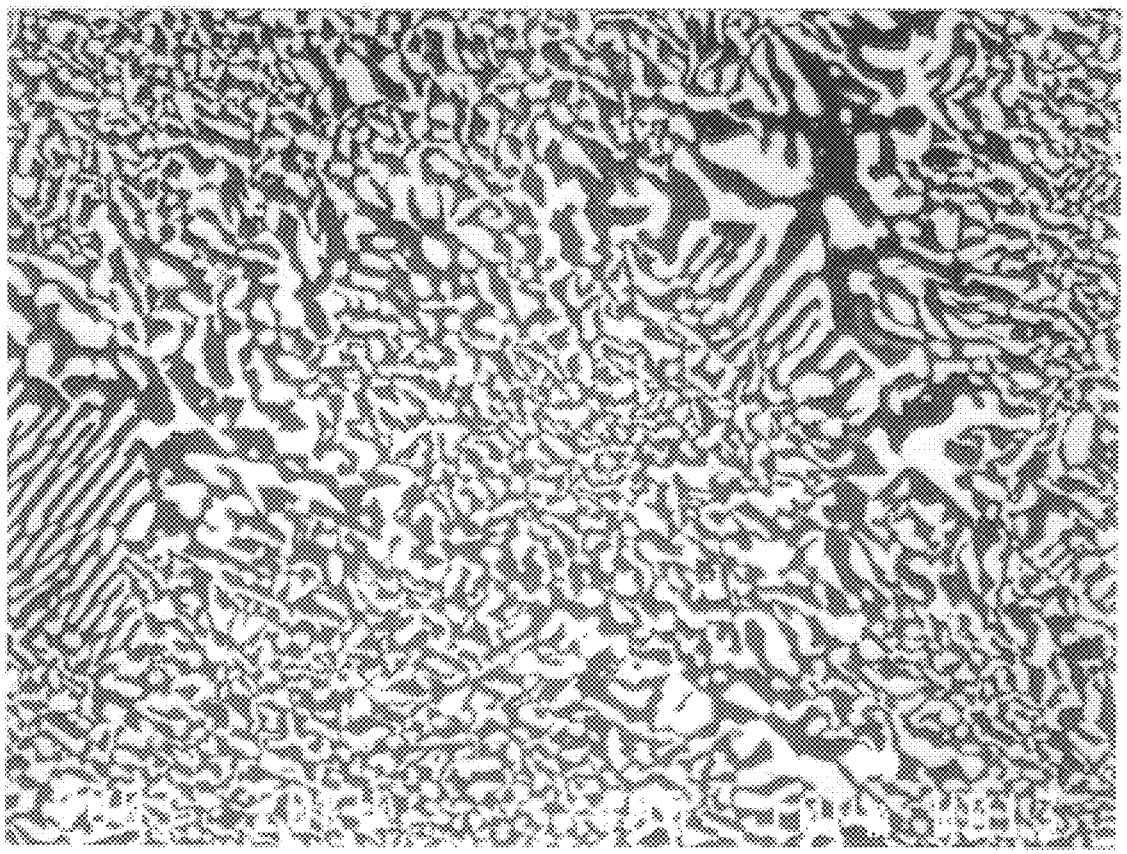
FIG. 14 is a SEM photograph showing the structure of the ceramic composite material in Comparative Example 3.

FIG. 14 is an electron microscopic photograph of the microstructure in the cross-section perpendicular to the direction of solidification of the solidified body, in which the white portion is a GdAlO$_3$ phase and the black portion is an Al$_2$O$_3$ phase. It was confirmed from FIG. 14 that the solidified body had a non-uniform structure having colonies and grain boundaries.

The X-ray diffraction of the cross-section of the solidified body perpendicular to the direction of solidification thereof was taken. As a result, diffraction peaks from a plurality of planes of $\alpha$-$Al_2O_3$ and diffraction peaks from a plurality of planes of $GdAlO_3$ were observed and it was confirmed that the solidified body was a ceramic composite material consisting of two phases of an $\alpha$-$Al_2O_3$ polycrystal and a $GdAlO_3$ polycrystal.

Table 3 shows the mechanical strength of this ceramic composite material. The mechanical strength shown in Table 3 is the value measured by the three point flexural test at 1650° C. in air.

Figure 15:
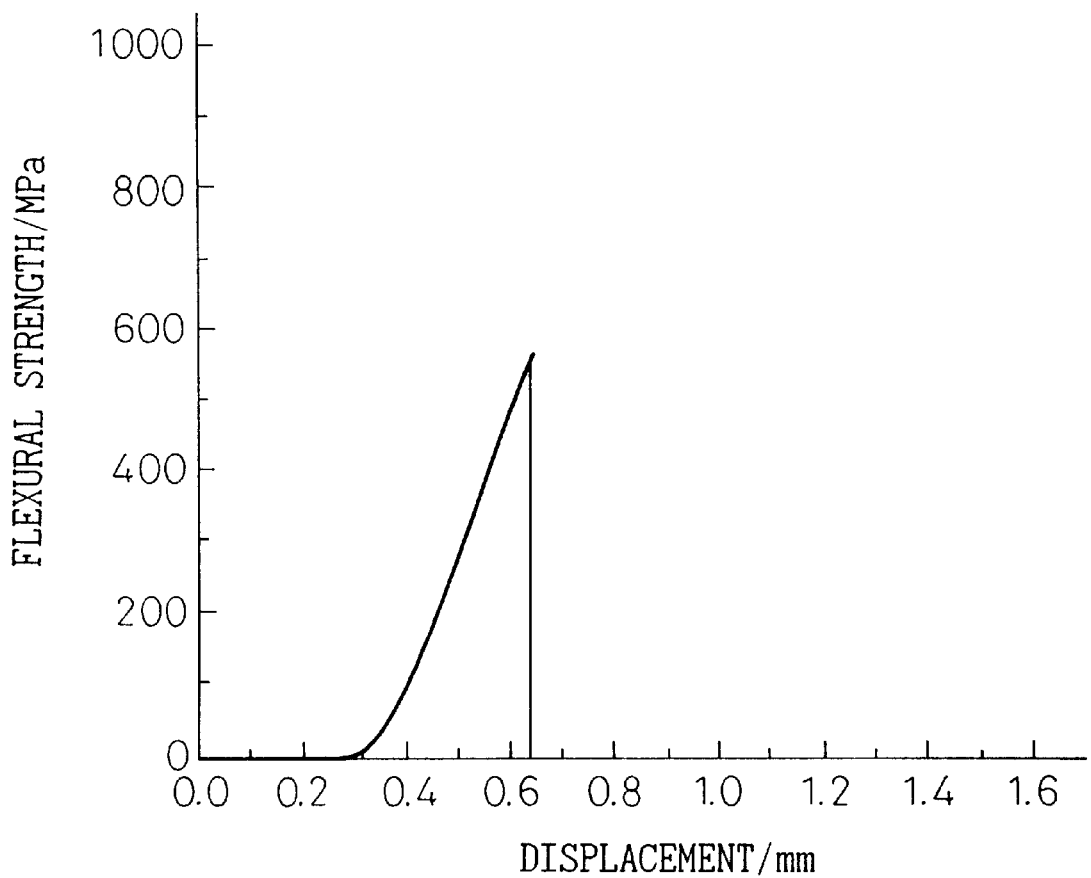
FIG. 15 is the stress-deformation curve in flexural test of the ceramic composite material in Comparative Example 3.

FIG. 15 shows the stress-deformation curve of the flexural test at 1650° C. FIG. 15 shows that the composite material exhibited a high yield of 580 MPa but upon yield it was fractured without a plastic deformation.

Example 4

An $\alpha$-$Al_2O_3$ powder and a $Y_2O_3$ powder were mixed in a ratio of 82.0/18.0 by mol %, followed by wet ball milling in ethanol as a medium to form a slurry. The ethanol was removed from the slurry by a rotary evaporator.

The obtained mixed powder was charged in a molybdenum crucible set in a chamber, the atmospheric pressure in the chamber was kept to $10^{-5}$ Torr, and the crucible was heated to 1900 to 2000° C. by a high frequency coil to melt the mixed powder. The crucible was then lowered at such a rate that the cooling rate was 50° C./hr, while the atmospheric pressure in the chamber was kept to $10^{-5}$ Torr, by which the unidirectional solidification was conducted to obtain a solidified body.

The solidified body with a diameter of 10 mm and a height of 50 mm was removed from the molybdenum crucible and then subjected to the zone melting method using a halogen lamp as a light source with a lowering speed of the solidified body of 10 mm/hr and a rotation speed of 2 rpm.

After the zone melting, an upper portion of 5 mm length with concentrated impurities was removed from the resultant solidified body.

The obtained solidified body and the starting powders were subjected to ICP analysis. The results are shown in Table 4. The starting powders contained some impurities in the order of about 200 ppm but each of the impurity levels was lowered to 100 ppm or less after the repeated zone melting.

TABLE 4

| | Content (ppm) | |
|---|---|---|
| Compound | Starting powder | Solidified body |
| $Dy_2O_3$ | 290 | 90 |
| $Ho_2O_3$ | 270 | 100 |
| $Er_2O_3$ | 260 | 85 |
| $Yb_2O_3$ | 240 | 100 |
| $SiO_2$ | 235 | 50 |

The thus purified solidified body was charged in a molybdenum crucible with the atmospheric pressure of $10^{-5}$ Torr, and the crucible was heated to 1900 to 2000° C. by a high frequency coil to melt the charged material. The crucible was then lowered at such a rate that the molten material was cooled at a cooling rate of 50° C./hr, to obtain a solidified body by unidirectional solidification.

Figure 16:
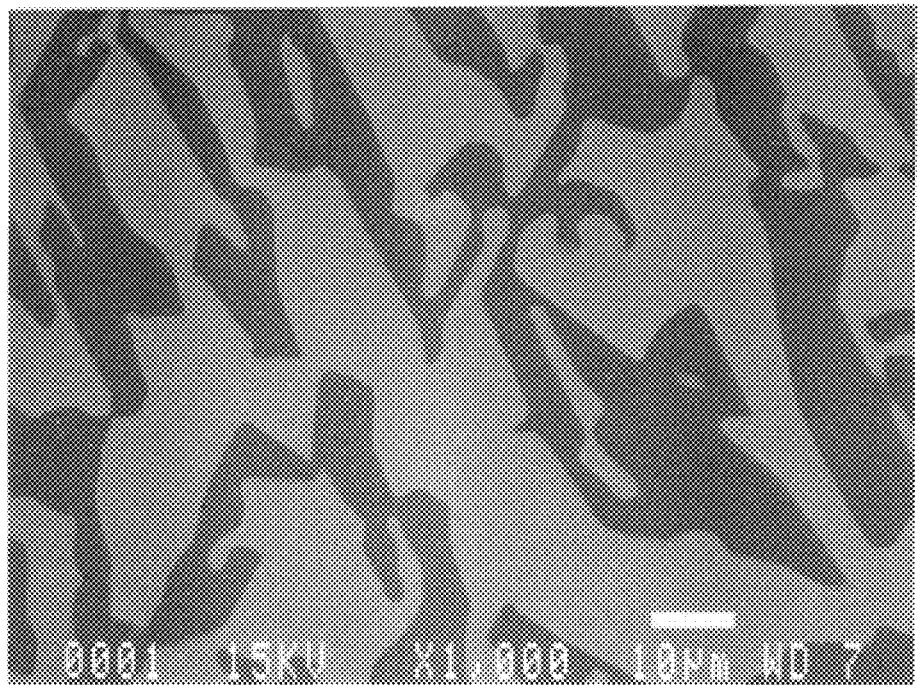
FIGS. 16 and 17 are SEM photographs showing the structure of the ceramic composite material in Example 4.

FIG. 16 is an electron microscopic photograph of the microstructure in the cross-section perpendicular to the direction of solidification of the solidified body, in which the white portion is a YAG (yttrium aluminum garnet) phase and the black portion is an $Al_2O_3$ phase. It was confirmed from FIG. 16 that the solidified body had a uniform structure having no colonies or grain boundaries and no pores or voids.

The X-ray diffraction of the cross-section of the solidified body perpendicular to the direction of solidification thereof was taken. As a result, only one diffraction peak from a specific plane of $\alpha$-$Al_2O_3$ and one diffraction peak from a specific plane of YAG were observed and it was confirmed that the solidified body was a ceramic composite material consisting of an $\alpha$-$Al_2O_3$ single crystal and a YAG single crystal.

Figure 17:
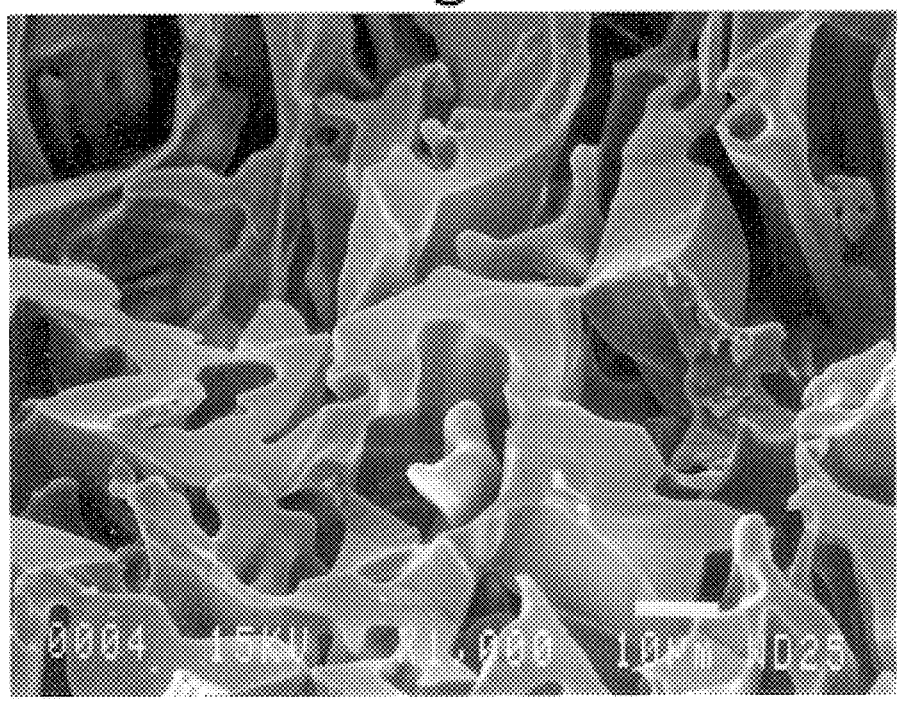

Only the $\alpha$-$Al_2O_3$ phase was removed from the solidified body in the same procedure as in Example 1. FIG. 17 shows an electron microscopic photograph of the thus obtained solidified body consisting only of the YAG phase which was three dimensionally continuous.

From the above, it was confirmed that the solidified body was a ceramic composite material having a microstructure consisting of two phases of $\alpha$-$Al_2O_3$ and YAG single crystal phases which were three dimensionally continuous and intertwined with each other.

Table 5 shows the tensile strength of the ceramic composite material in air at a temperature from room temperature to 1750° C. The direction of tension applied to the sample was parallel to the direction of the unidirectional solidification.

Figure 18:
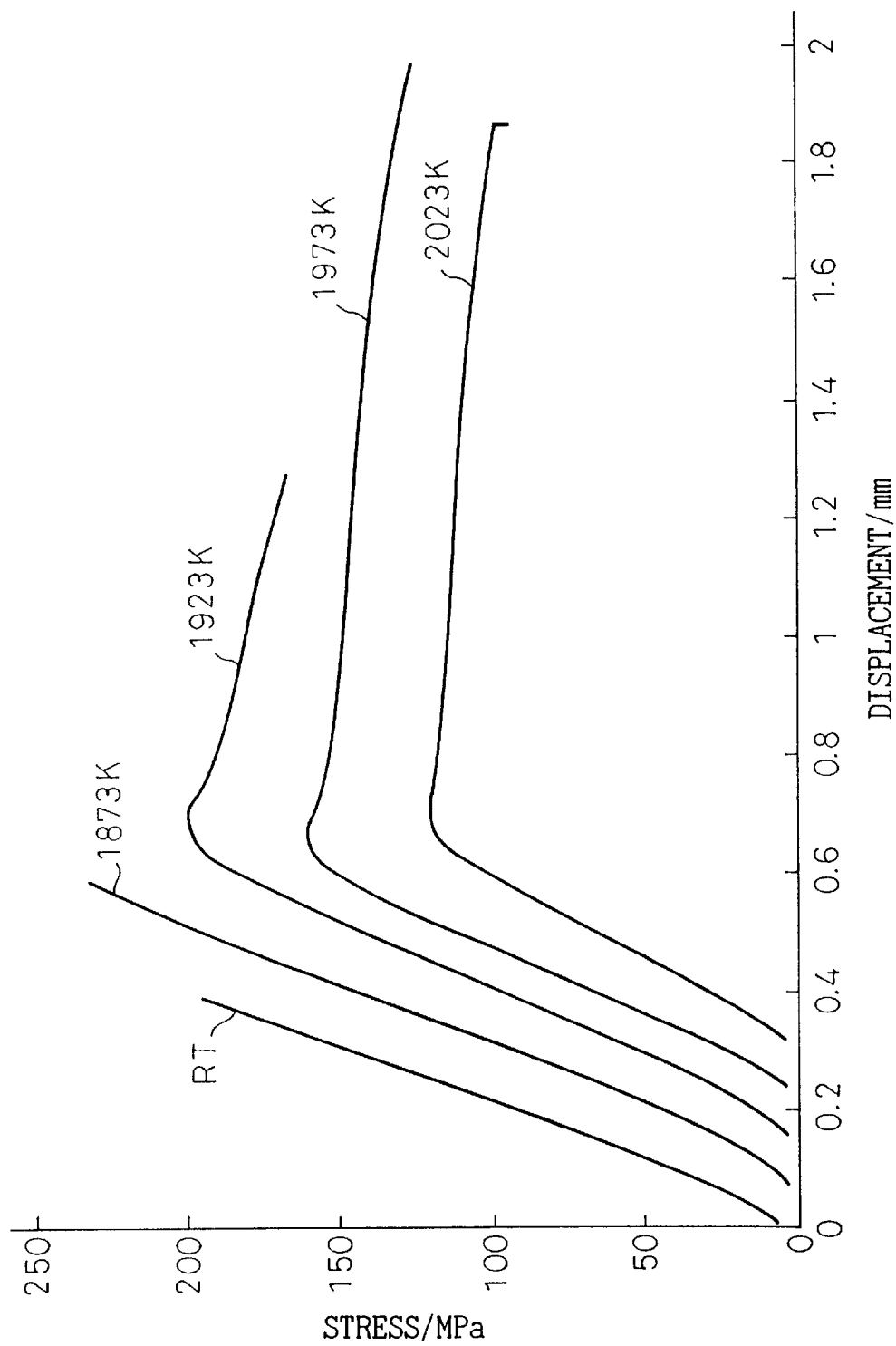
FIG. 18 is the stress-deformation curve in tensile test of the ceramic composite material in Example 4.
Figure 19:
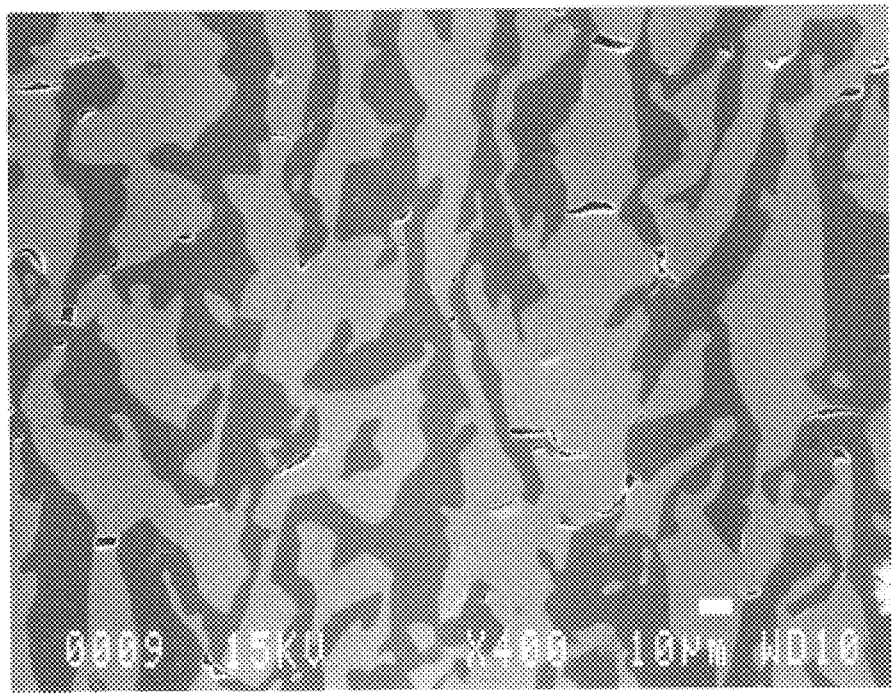
FIG. 19 is a SEM photograph showing the structure of the ceramic composite material before the flexural test in Example 4.

FIG. 18 shows the temperature dependency of the stress-deformation curve of the tensile test. FIG. 18 shows that the $\alpha$-$Al_2O_3$/YAG composite material exhibited a brittle fracture up to 1600° C.; a yielding appeared at 1650° C. or more, clearly showing a plastic deformation; and the composite material exhibited an elongation of about 10% at 1700° C. FIG. 19 shows an electron microscopic photograph of the microstructure of the solidified body in parallel with the applied tension after the tensile test at 1650° C.

Figure 20:
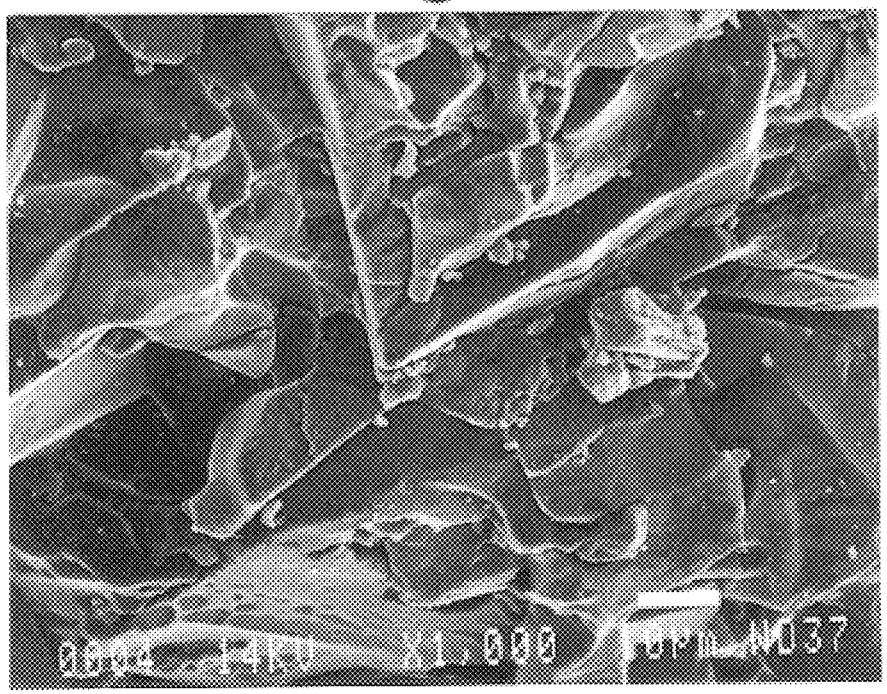
FIG. 20 is a SEM photograph showing the structure of the ceramic composite material after the flexural test in Example 4.

FIG. 20 shows an electron microscopic photograph of a section of the sample fractured by the tensile test at 1700° C.

It was deemed from these photographs that the $\alpha$-$Al_2O_3$/YAG composite material produced by the unidirectional solidification method exhibited a plastic deformation at 1650° C. or more and the yielding stress was 200 MPa.

TABLE 5

| Test temperature (° C.) | Tensile strength (MPa) |
|---|---|
| Room temperature | 200 |
| 1600 | 230 |
| 1650 | 200 |
| 1700 | 160 |
| 1750 | 130 |

Comparative Example 4

An $\alpha$-$Al_2O_3$ powder and a $Y_2O_3$ powder were mixed in a mol % ratio of 82.0/18.0, followed by wet ball milling in ethanol as a medium to form a slurry. The ethanol was removed from the slurry by a rotary evaporator.

The obtained mixed powder was charged in a molybdenum crucible set in a chamber, the atmospheric pressure in the chamber was kept to $10^{-5}$ Torr, and the crucible was heated to 1900 to 2000° C. by a high frequency coil to melt the mixed powder. The crucible was then lowered at such a rate that the cooling rate was 50° C./hr, while the atmospheric pressure in the chamber was kept to $10^{-5}$ Torr, by which the unidirectional solidification was conducted to obtain a solidified body.

The obtained solidified body and the starting powders were subjected to ICP analysis. The results are shown in Table 6. The starting powders contained some impurities in the order of about 200 ppm but each of the impurity levels was lowered to some extent.

TABLE 6

| Compound | Content (ppm) | |
|---|---|---|
| | Starting powder | Solidified body |
| $Dy_2O_3$ | 290 | 240 |
| $Ho_2O_3$ | 270 | 210 |
| $Er_2O_3$ | 260 | 225 |
| $Yb_2O_3$ | 240 | 200 |
| $SiO_2$ | 235 | 210 |

Figure 21:
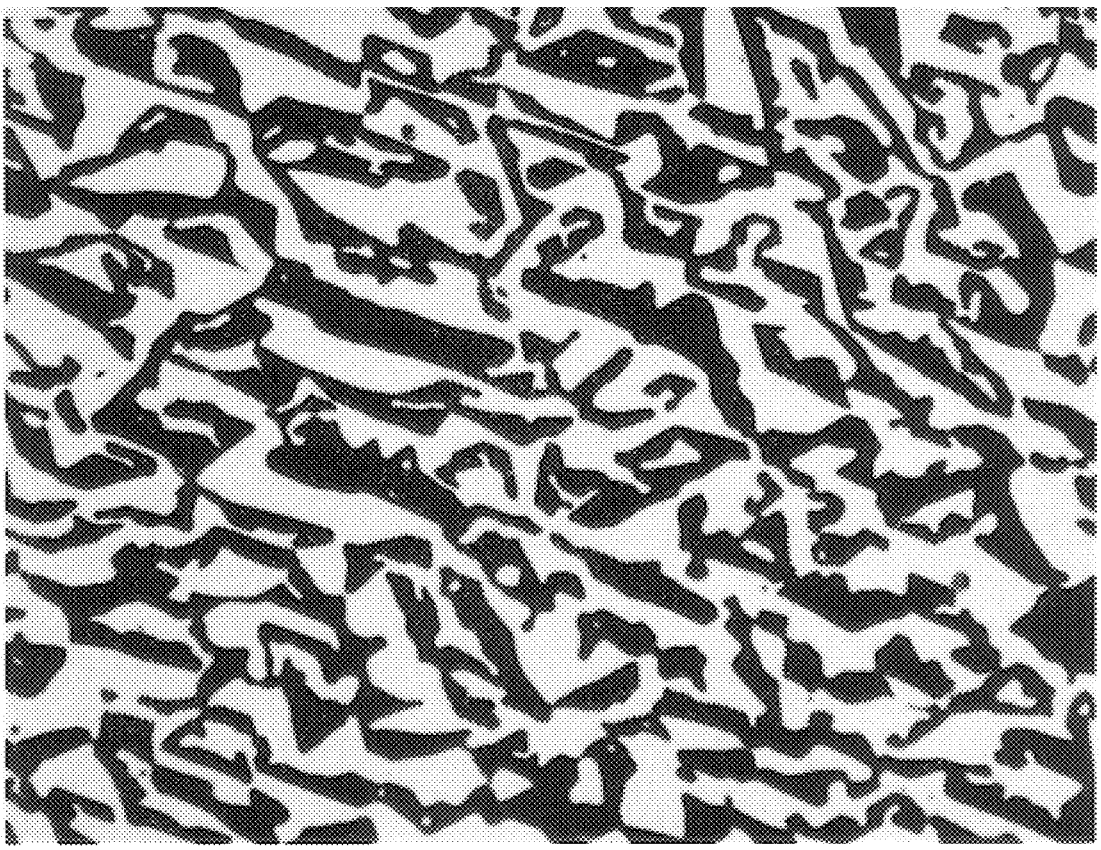
FIGS. 21 and 22 are SEM photographs showing the structure of the ceramic composite material in Comparative Example 4.
Figure 22:
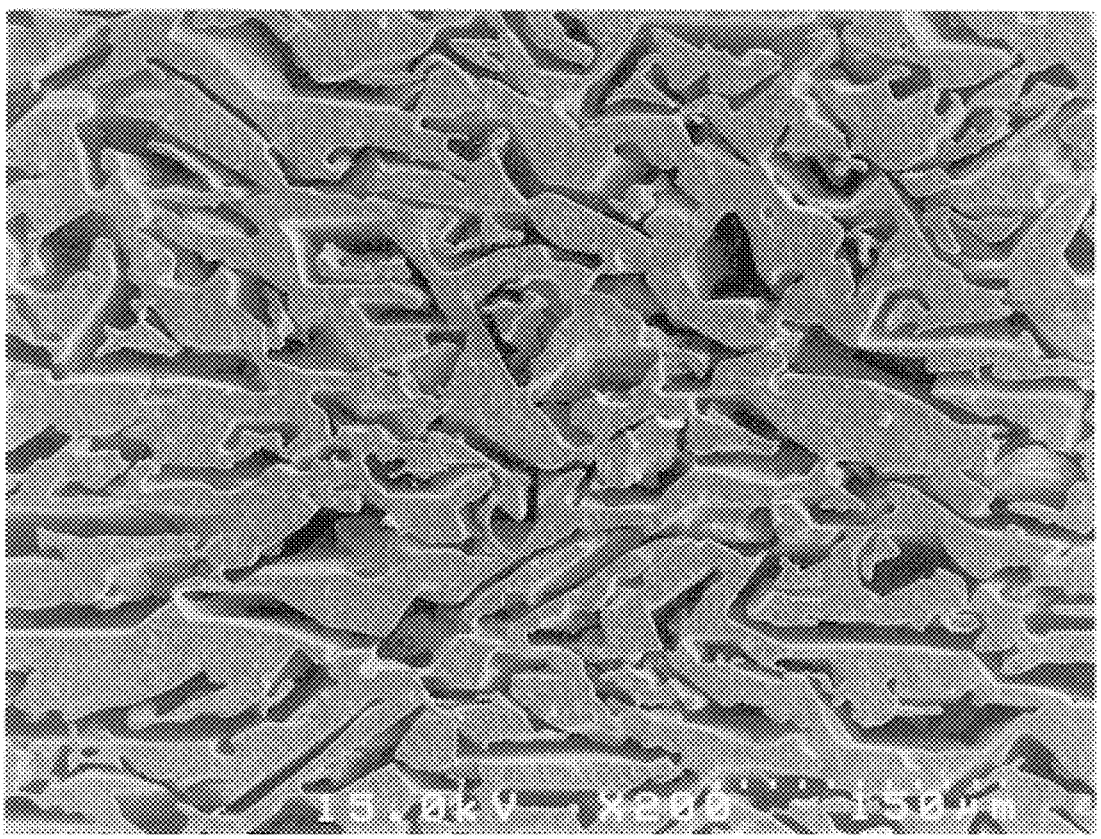

FIG. 21 is an electron microscopic photograph of the microstructure in the cross-section perpendicular to the direction of solidification of the solidified body, in which the white portion is a YAG phase and the black portion is an $\alpha$-$Al_2O_3$ phase. It was confirmed from FIG. 21 that the solidified body had a uniform structure having no colonies or grain boundaries and no pores or voids.

The X-ray diffraction of the cross-section of the solidified body perpendicular to the direction of solidification thereof was taken. As a result, only one diffraction peak from a specific plane of $\alpha$-$Al_2O_3$ and one diffraction peak from a specific plane of YAG were observed.

From the above, it was confirmed that the solidified body was a ceramic composite material having a microstructure consisting of two phases of $\alpha$-$Al_2O_3$ single crystal and YAG single crystal which were three dimensionally continuous and, in a complex manner, intertwined with each other.

Table 7 shows the tensile strength of the ceramic composite material in air at a temperature from room temperature to 1750° C. The direction of tension applied to the sample was parallel to the unidirectional solidification.

Figure 23:
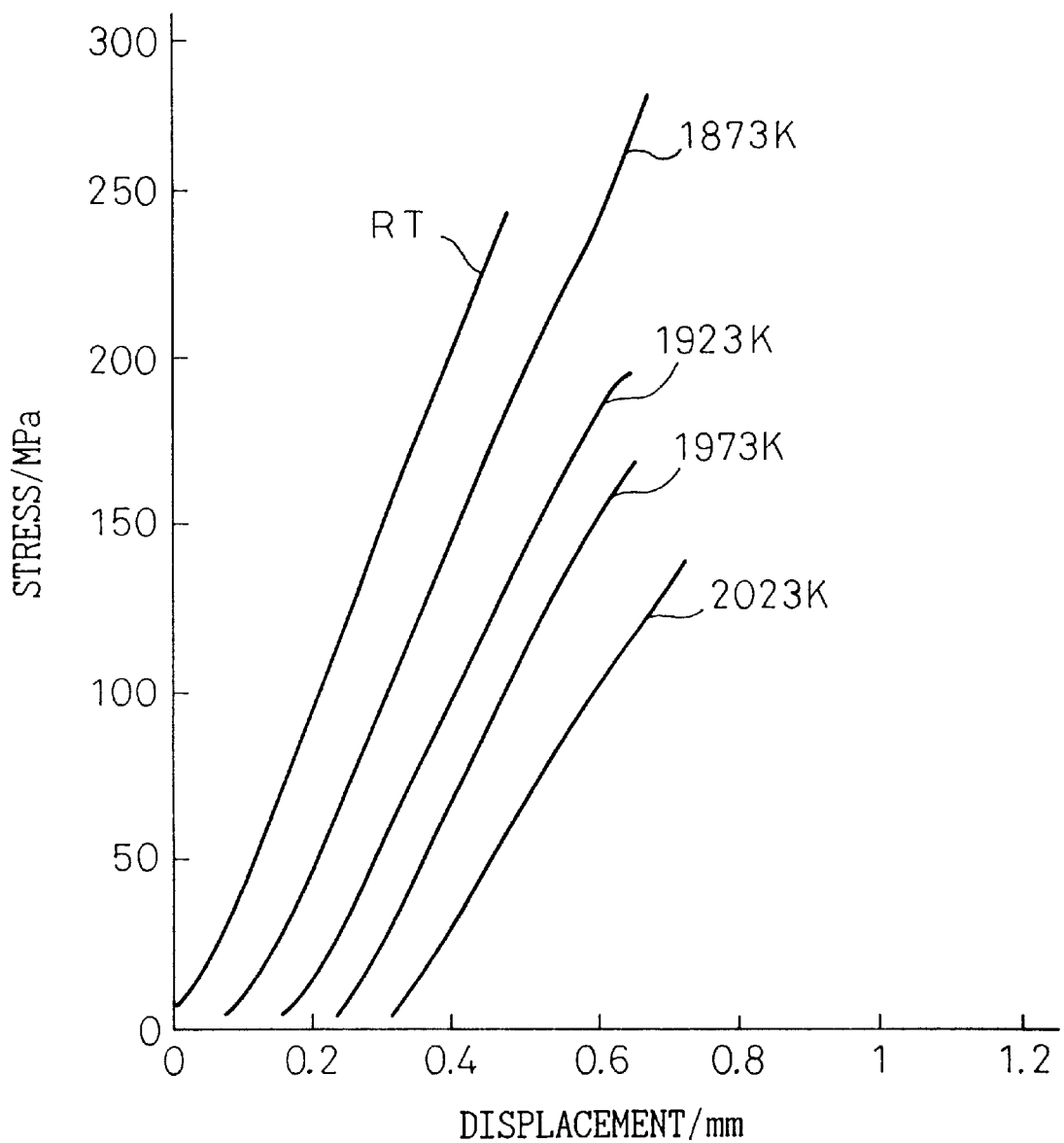
FIG. 23 is the stress-deformation curve in flexural test of the ceramic composite material in Comparative Example 4.

FIG. 23 shows the temperature dependency of the stress-deformation curve of the tensile test. FIG. 23 shows that the $\alpha$-$Al_2O_3$/YAG composite material exhibited a brittle fracture from room temperature to 1750° C.

TABLE 7

| Test temperature (° C.) | Tensile strength (MPa) |
|---|---|
| Room temperature | 250 |
| 1600 | 280 |
| 1650 | 200 |
| 1700 | 170 |
| 1750 | 140 |

Example 5

An $\alpha$-$Al_2O_3$ powder and a $Er_2O_3$ powder were mixed in a ratio of 81.1/18.9 by mol %, followed by wet ball milling in ethanol as a medium to form a slurry. The ethanol was removed from the slurry by a rotary evaporator.

The obtained mixed powder was charged in a molybdenum crucible set in a chamber, the atmospheric pressure in the chamber was kept to $10^{-5}$ Torr, and the crucible was heated to 1900 to 2000° C. by a high frequency coil to melt the mixed powder. The crucible was then lowered in such a rate that the cooling rate was 50° C./hr, while the atmospheric pressure in the chamber was kept to $10^{-5}$ Torr, by which the unidirectional solidification was conducted to obtain a solidified body.

The solidified body with a diameter of 10 mm and a height of 50 mm was removed from the molybdenum crucible and then subjected to the zone melting method using a halogen lamp as a light source with a lowering speed of the solidified body of 10 mm/hr and a rotation speed of 2 rpm.

After the zone melting, an upper portion of 5 mm length with concentrated impurities was removed from the resultant solidified body.

The obtained solidified body and the starting powders were subjected to ICP analysis. The results are shown in Table 8. The starting powders contained some impurities in the order of about 200 ppm but each of the impurity levels was lowered to 100 ppm or less after the repeated zone molting.

TABLE 8

| Compound | Content (ppm) | |
|---|---|---|
| | Starting powder | Solidified body |
| $Dy_2O_3$ | 230 | 100 |
| CaO | 245 | 90 |
| $Tm_2O_3$ | 255 | 100 |
| $Yb_2O_3$ | 260 | 95 |
| $SiO_2$ | 220 | 60 |

The thus purified solidified body was charged in a molybdenum crucible with the atmospheric pressure of $10^{-5}$ Torr, and the crucible was heated to 1900 to 2000° C. by a high frequency coil to melt the charged material. The crucible was then lowered in such a rate that the molten material was cooled at a cooling rate of 50° C./hr, to obtain a solidified body by unidirectional solidification.

Figure 24:
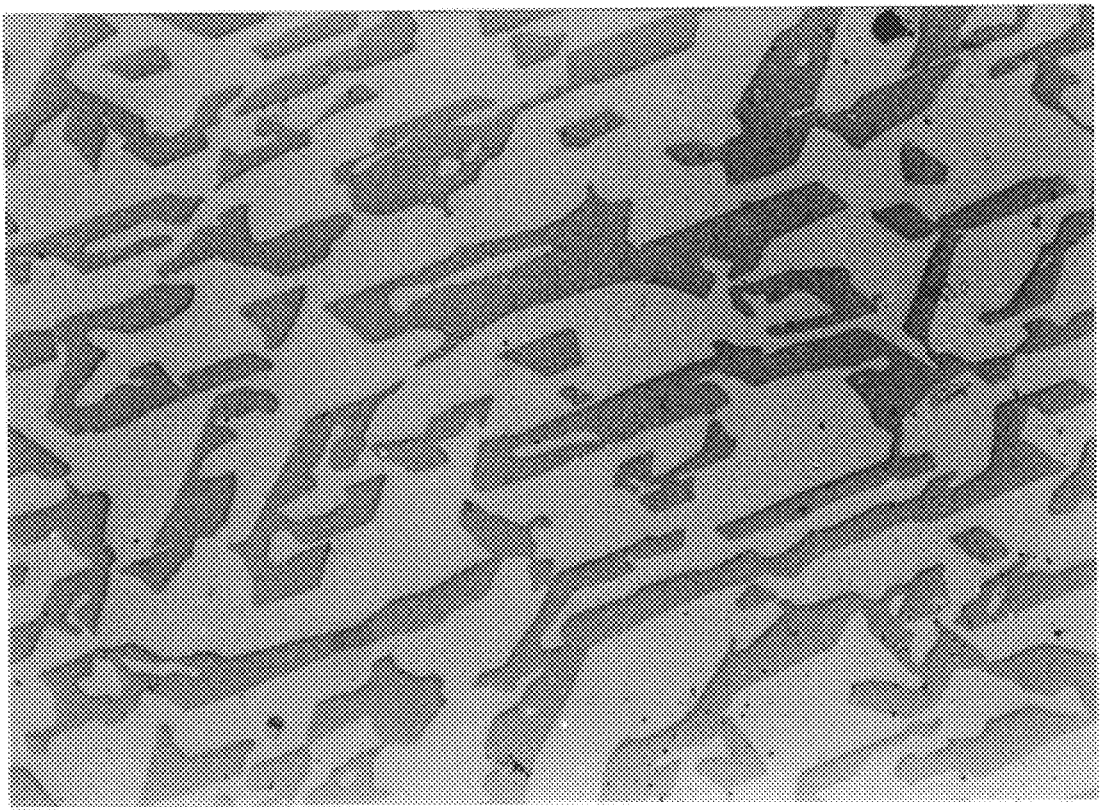
FIGS. 24 and 25 are SEM photographs showing the structure of the ceramic composite material in Example 5.

FIG. 24 is an electron microscopic photograph of the microstructure in the cross-section perpendicular to the direction of solidification of the solidified body, in which the light portion is an $Er_3Al_5O_{12}$ phase and the dark portion is an $Al_2O_3$ phase. It was confirmed from FIG. 24 that the solidified body had a uniform structure having no colonies or grain boundaries and no pores or voids.

The X-ray diffraction of the cross-section of the solidified body perpendicular to the direction of solidification thereof was taken. As a result, only one diffraction peak from a specific plane of $\alpha$-$Al_2O_3$ and one diffraction peak from a specific plane of $Er_3Al_5O_{12}$ were observed and it was confirmed that the solidified body was a ceramic composite material consisting of an $\alpha$-$Al_2O_3$ single crystal and an $Er_3Al_5O_{12}$ single crystal.

Figure 25:
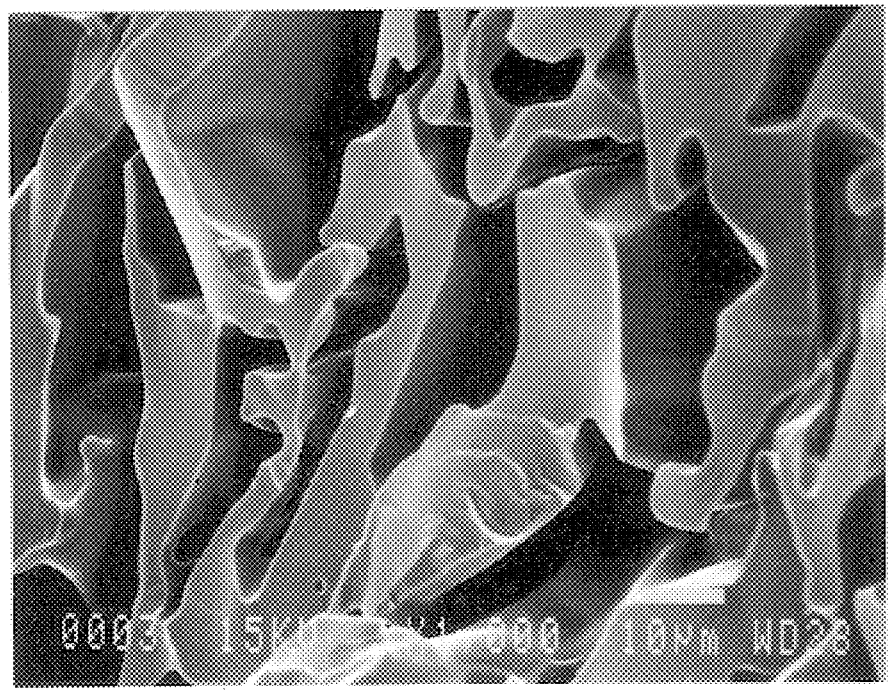

Only the $\alpha$-$Al_2O_3$ phase was removed from the solidified body in the same procedure as in Example 1. FIG. 25 shows an electron microscopic photograph of the thus obtained solidified body consisting only of the $Er_3Al_5O_{12}$ phase which was three dimensionally continuous.

From the above, it was confirmed that the solidified body was a ceramic composite material having a microstructure consisting of two phases of $\alpha$-$Al_2O_3$ single crystal and $Er_3Al_5O_{12}$ single crystal which were three dimensionally continuous and in a complex manner intertwined with each other.

Upon the tensile strength test of the ceramic composite material in air at a temperature from room temperature to 1800° C., the $\alpha$-$Al_2O_3$/$Er_3Al_5O_{12}$ composite material produced by the unidirectional solidification method exhibited a plastic deformation at 1650° C. or more, similar to the $\alpha$-$Al_2O_3$/YAG composite material of Example 4.

Example 6

An $\alpha$-$Al_2O_3$ powder and a $Y_2O_3$ powder were mixed in a mol % ratio of 82.0/18.0, followed by wet ball milling in ethanol as a medium to form a slurry. The ethanol was removed from the slurry by a rotary evaporator.

The obtained mixed powder was charged in a molybdenum crucible set in a chamber, the atmospheric pressure in the chamber was kept to $10^{-5}$ Torr, and the crucible was heated to 1900 to 2000° C. by a high frequency coil to melt the mixed powder. The crucible was then lowered at such a rate that the cooling rate was 50° C./hr, while the atmospheric pressure in the chamber was kept to $10^{-5}$ Torr, by which the unidirectional solidification was conducted to obtain a solidified body.

The solidified body with a diameter of 10 mm and a height of 50 mm was removed from the molybdenum crucible and then subjected to the zone melting method using a halogen lamp as a light source with a lowering speed of the solidified body of 10 mm/hr and a rotation speed of 2 rpm.

After the zone melting, an upper portion of 5 mm length with concentrated impurities was removed from the resultant solidified body.

The obtained solidified body and the starting powders were subjected to ICP analysis. The results are shown in Table 4. The starting powders contained some impurities in the order of about 200 ppm but each of the impurity levels was lowered to 100 ppm or less after the repeated zone melting.

The thus purified solidified body was charged in a molybdenum crucible with the atmospheric pressure of $10^{-5}$ Torr, and the crucible was heated to 1900 to 2000° C. by a high frequency coil to melt the charged material. The crucible was then lowered in such a rate that the molten material was cooled at a cooling rate of 50° C./hr, to obtain a solidified body by unidirectional solidification.

Figure 26:
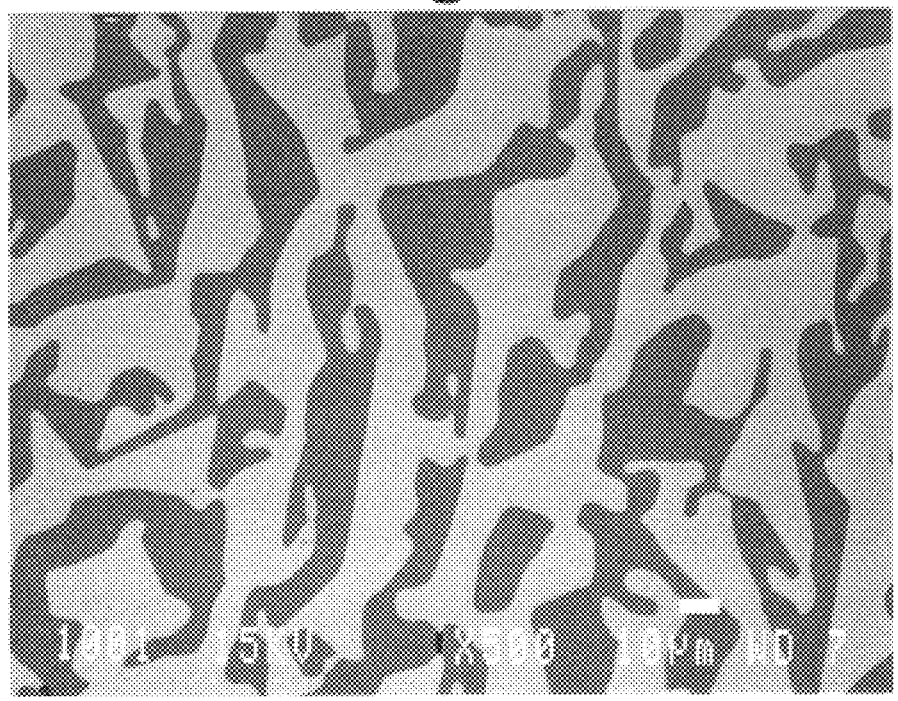
FIGS. 26 and 27 are SEM photographs showing of the structure of the ceramic composite material in Example 6.
Figure 27:
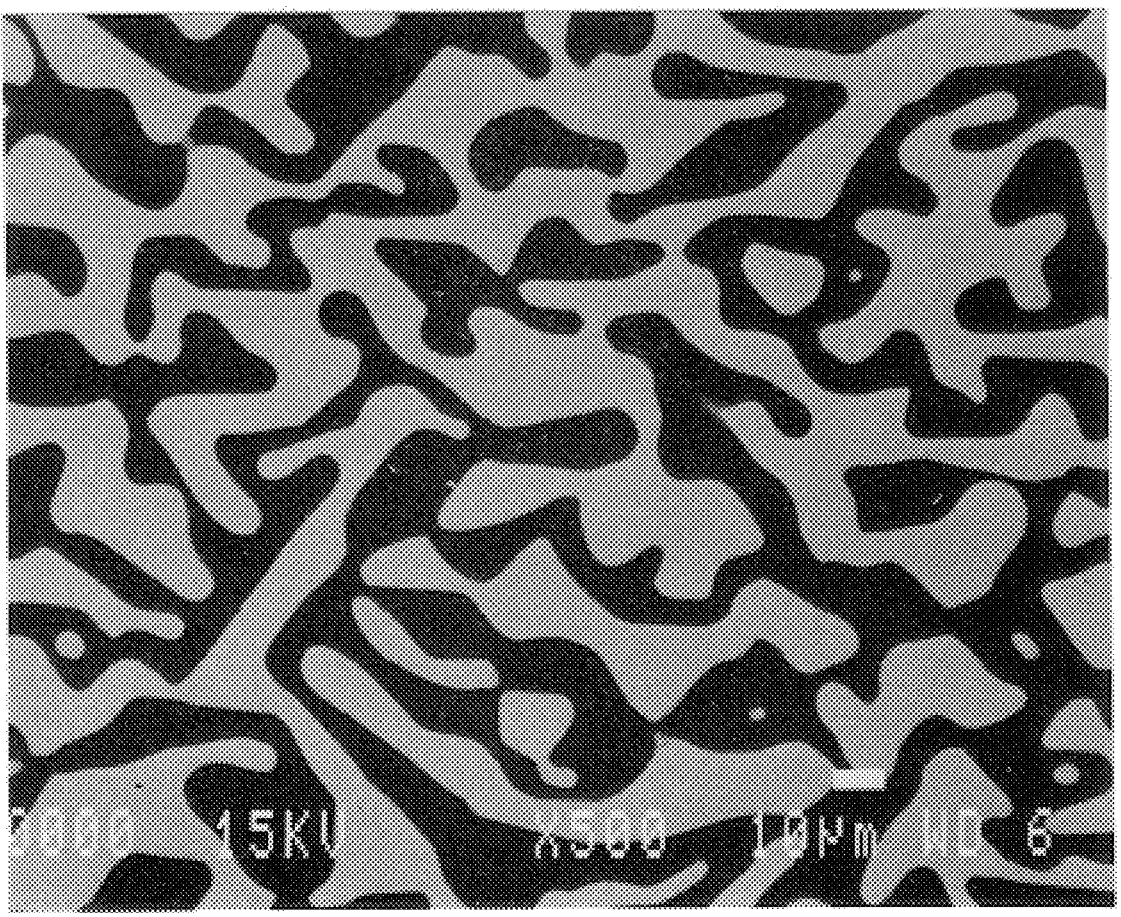

FIG. 26 is an electron microscopic photograph of the microstructure in the cross-section perpendicular to the direction of solidification of the solidified body, in which the white portion is a YAG phase and the black portion is an $Al_2O_3$ phase. It was confirmed from FIG. 26 that the solidified body had a uniform structure having no colonies or grain boundaries and no pores or voids.

The X-ray diffraction of the cross-section of the solidified body perpendicular to the direction of solidification thereof was taken after the solidified body was heated at 1700° C. in air for 1000 hours, the 1700° C. corresponding to 0.93 Tm (where Tm stands for the melting point of this material of 1820° C.). Table 9 shows the flexural strength of the ceramic composite material before and after the above heat treatment.

TABLE 9

|  | Flexural strength at 1700° C. |
| --- | --- |
| Before heat treatment | 520 MPa |
| After heat treatment | 525 MPa |

As shown in these results, the $\alpha$-$Al_2O_3$/YAG composite material produced by the unidirectional solidification method exhibited an extremely excellent microstructure stability at a high temperature as 1700° C., and exhibited substantially no weight change before and after said heat treatment.

Example 7

This Example followed Example 1. As shown in the SEM photograph in FIG. 1, the solidified body produced in Example 1 had a uniform microstructure having no colonies or grain boundaries and no pores or voids. The X-ray diffraction of the cross-section of the solidified body perpendicular to the direction of solidification thereof showed that the solidified body was a ceramic composite material consisting of two phases of an $\alpha$-$Al_2O_3$ single crystal and a $GdAlO_3$ single crystal.

Figure 28A:
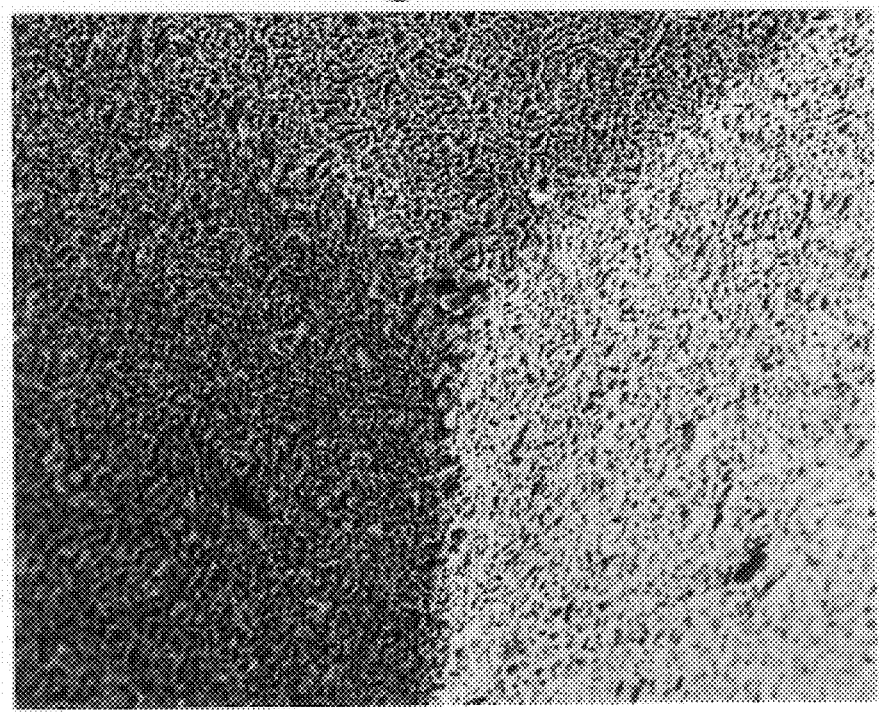
Figure 28B:
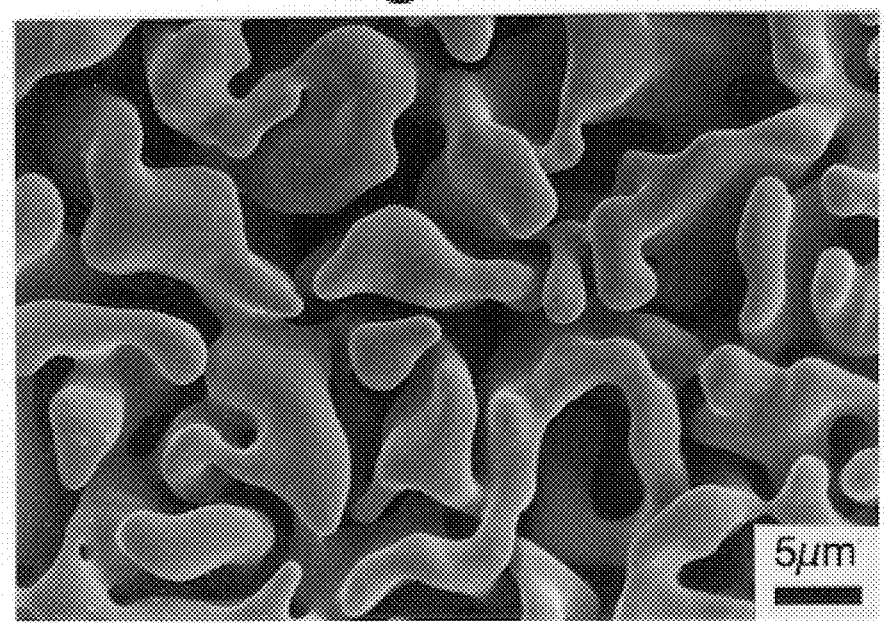

This solidified body produced in Example 1 was then immersed in an aqueous solution of nitric acid and fluoric acid in a weight % ratio of 1:5 for 20 hours to remove only the $\alpha$-$Al_2O_3$ phase. FIGS. 28A and 28B show SEM photographs of the thus obtained solidified body consisting only of the $GdAlO_3$ phase. FIG. 28A is a perspective view of a sample having a rectangular shape from a corner direction and FIG. 28B is an enlarged view of FIG. 28A. FIG. 28B clearly shows that the structure consisting of the $GdAlO_3$ phase and the pores intertwined with each other is a three dimensional structure.

From the above, it was confirmed that the solidified body was a ceramic composite material having a microstructure consisting of two phases of $\alpha$-$Al_2O_3$ single crystal and $GdAlO_3$ single crystal which were three dimensionally continuous and intertwined with each other, and, after removal of $\alpha$-$Al_2O_3$, was a porous single crystal $GdAlO_3$ ceramic material having a network structure in which the $GdAlO_3$ phase was three dimentionally continuous.

Table 10 shows the mechanical strength and porosity of this porous ceramic material. The mechanical strength shown in Table 10 is the values measured by the three point flexural test at room temperature in argon and at 1950° C. in air. The porous ceramic material of this Example had a high flexural strength of 250 MPa even at 1950° C. even though it had a high porosity of 60%. Further, the porosity and the flexural strength of the material were not changed after heat treatment in air at 1800° C. for 100 hours.

TABLE 10

|  | Porosity | Flexural strength (MPa) | |
| --- | --- | --- | --- |
| Example No. | (%) | Room temp. | 1950° C. |
| Example 7 | 60 | 250 | 250 |
| Example 8 | 58 | 210 | 200 |

Example 8

This Example followed Example 2 in which the cooling rate was 100° C./hr. As shown in the SEM photograph in FIG. 10, the solidified body produced in Example 2 had a uniform microstructure having no colonies or grain boundaries and no pores or voids. The X-ray diffraction of the cross-section of the solidified body perpendicular to the direction of solidification thereof showed that the solidified body was a ceramic composite material consisting of two phases of an $\alpha$-$Al_2O_3$ single crystal and a $GdAlO_3$ polycrystal.

Figure 29A:
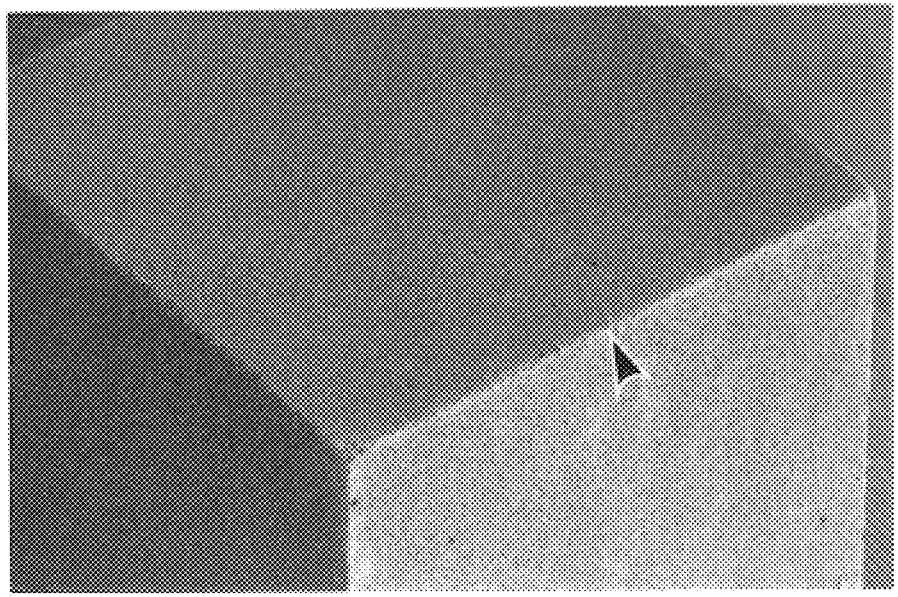
Figure 29B:
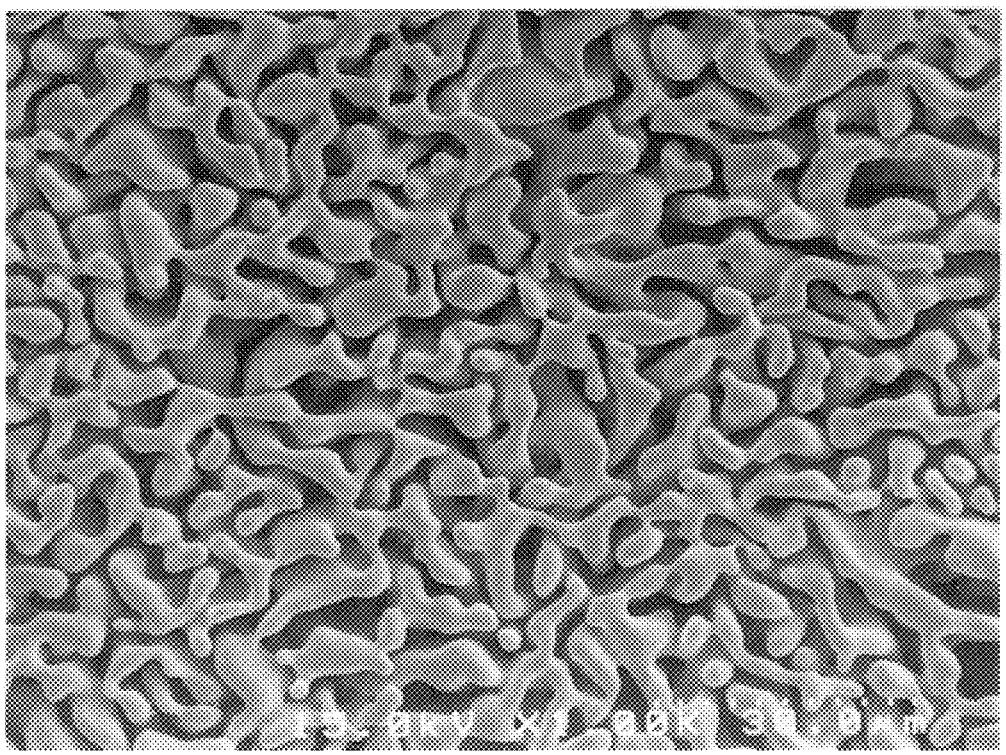

This solidified body produced in Example 2 was then immersed in an aqueous solution of nitric acid and fluoric acid in a weight % ratio of 1:5 for 20 hours to remove only the $\alpha$-$Al_2O_3$ phase. FIGS. 29A and 29B show SEM photographs of the thus obtained solidified body consisting only of the $GdAlO_3$ phase. FIG. 29A is a perspective view of a sample having a rectangular shape from a corner direction and FIG. 29B is an enlarged view of the portion indicated by the arrow in FIG. 29A. FIG. 29B clearly shows that the structure consisting of the $GdAlO_3$ phase and the pores intertwined with each other is a three dimensional structure.

From the above, it was confirmed that the solidified body was a ceramic composite material having a microstructure consisting of two phases of α-$Al_2O_3$ single crystal and $GdAlO_3$ polycrystal which were three dimensionally continuous and intertwined with each other, and, after removal of α-$Al_2O_3$, was a porous polycrystal $GdAlO_3$ ceramic material having a network structure in which the $GdAlO_3$ phase was three dimensionally continuous.

Table 10 shows the mechanical strength and porosity of this porous ceramic material. The mechanical strength shown in Table 10 is the value measured by the three point flexural test at room temperature in argon and at 1950° C. in air. The porous ceramic material of this Example had a high flexural strength of 200 MPa at 1950° C. even though it had a high porosity of 58%. Further, the porosity and the flexural strength of the material were not changed after heat treatment in air at 1800° C. for 100 hours.

Comparative Example 5

An α-$Al_2O_3$ powder and a $Gd_2O_3$ powder were mixed in the same ratio as in Example 7 by wet ball milling in ethanol as a medium. The ethanol was removed from the formed slurry by a rotary evaporator.

The obtained mixed powder was charged in a graphite die and sintered, while pressing at a pressure of 500 kg/mm², at a temperature of 1680° C. and under an atmospheric pressure of $10^{-2}$ Torr for 2 hours.

By X-ray diffraction of the sintered body, diffraction peaks from a plurality of planes of α-$Al_2O_3$ and diffraction peaks from a plurality of planes of $GdAlO_3$ were observed and it was confirmed that the sintered body was a ceramic composite material consisting of an α-$Al_2O_3$ polycrystal and a $GdAlO_3$ polycrystal.

The sintered body was then immersed in an aqueous solution of nitric acid and fluoric acid in a weight % ratio of 1:5 for 20 hours to remove only the α-$Al_2O_3$.

Table 11 shows the mechanical strength of the thus obtained porous sintered $GdAlO_3$ material consisting only of the $GdAlO_3$ phase. The mechanical strength shown in Table 11 is the value measured by the three point flexural test in air at room temperature. The mechanical strength is only 35 MPa. The flexural strength at 1950° C. could not be measured since the sample did not keep its shape at that temperature.

TABLE 11

| Example No. | Flexural strength at room temperature |
| --- | --- |
| Com. Ex. 5 | 35 MPa |
| Com. Ex. 6 | 30 MPa |
| Com. Ex. 7 | 27 MPa |

Example 9

This Example followed Example 4 in which an α-$Al_2O_3$ powder and a $Y_2O_3$ powder were the starting powders. As shown in the SEM photograph in FIG. 16, the solidified body produced in Example 4 had a uniform microstructure having no colonies or grain boundaries and no pores or voids. The X-ray diffraction of the cross-section of the solidified body perpendicular to the direction of solidification thereof showed that the solidified body was a ceramic composite material consisting of two phases of an α-$Al_2O_3$ single crystal and a YAG single crystal.

Figure 30A:
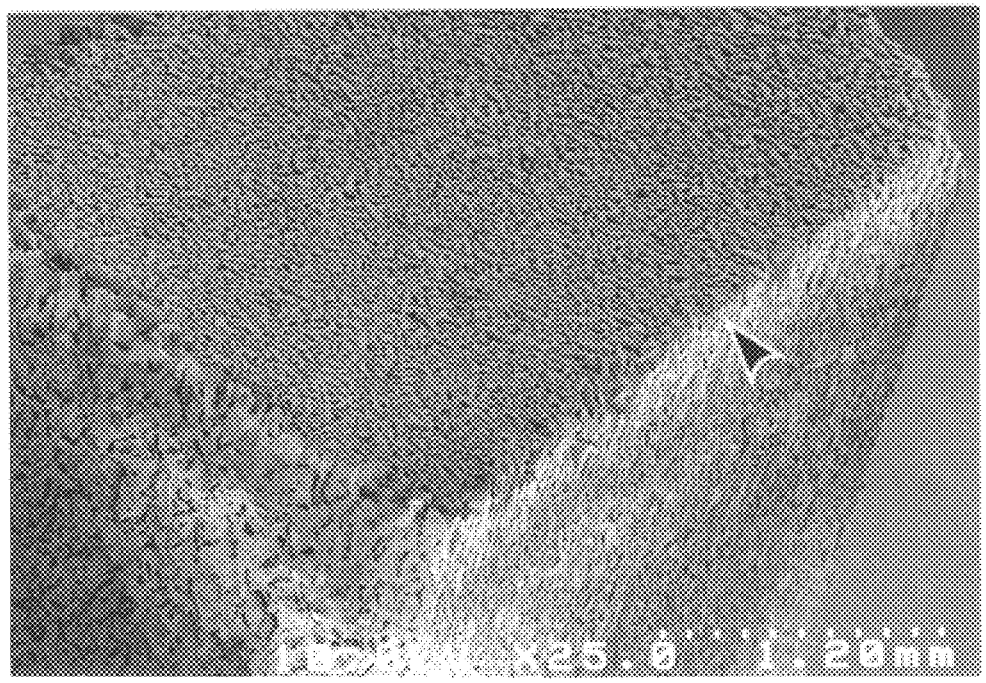
Figure 30B:
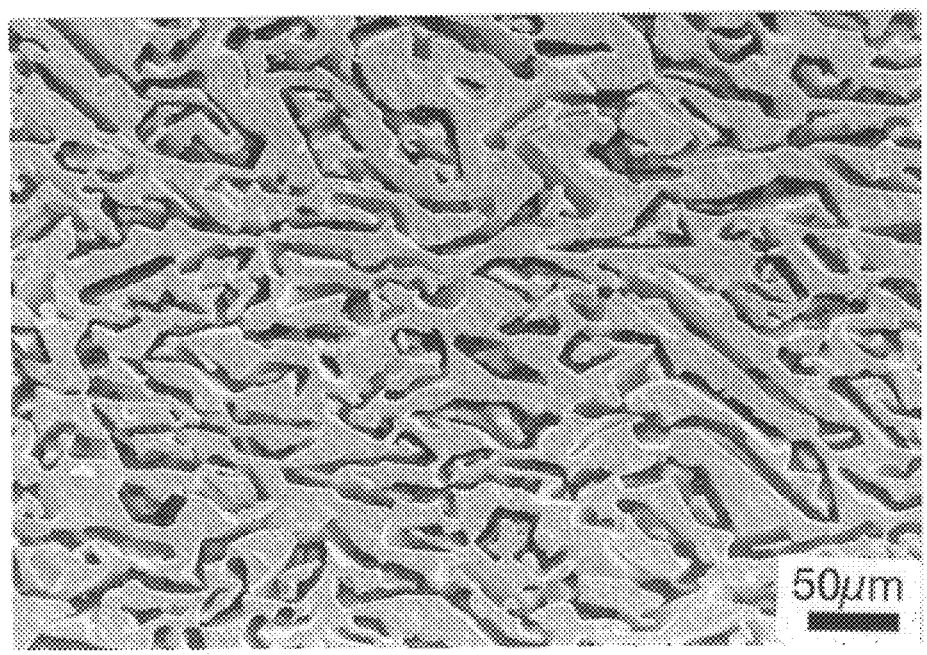

This solidified body produced in Example 4 was then immersed in an aqueous solution of nitric acid and fluoric acid in a weight % ratio of 1:5 for 20 hours to remove only the α-$Al_2O_3$ phase. FIGS. 30A and 30B show SEM photographs of the thus obtained solidified body consisting only of the $GdAlO_3$ phase. FIG. 30A is a perspective view of a sample having a rectangular shape from a corner direction and FIG. 30B is an enlarged view of the portion indicated by the arrow in FIG. 30A. FIG. 30B clearly shows that the structure consisting of the $GdAlO_3$ phase and the pores intertwined with each other is a three dimensional structure.

From the above, it was confirmed that the solidified body was a ceramic composite material having a microstructure consisting of two phases of α-$Al_2O_3$ single crystal and YAG single crystal which were three dimensionally continuous and intertwined with each other, and, after removal of α-$Al_2O_3$, was a porous single crystal YAG ceramic material.

Table 12 shows the mechanical strength and porosity of this porous ceramic material. The mechanical strength shown in Table 12 is the value measured by the three point flexural test in argon at room temperature and at 1900° C. in air. The porous ceramic material of this Example had a high flexural strength of 170 MPa at 1900° C. even though it had a high porosity of 55%. Further, the porosity and the flexural strength of the material were not changed after heat treatment in air at 1800° C. for 100 hours.

TABLE 12

| | Porosity | Flexural strength (MPa) | |
| --- | --- | --- | --- |
| Example No. | (%) | Room temp. | 1900° |
| Example 9 | 55 | 175 | 170 |
| Example 10 | 45 | 168 | 165 |

Example 10

An α-$Al_2O_3$ powder and a $Er_2O_3$ powder were mixed in a mol % ratio of 81.1/18.9, followed by wet ball milling in ethanol as a medium to form a slurry. The ethanol was removed from the slurry by a rotary evaporator.

The obtained mixed powder was charged in a molybdenum crucible set in a chamber, the atmospheric pressure in the chamber was kept to $10^{-5}$ Torr, and the crucible was heated to 1900 to 2000° C. by a high frequency coil to melt the mixed powder. The crucible was then lowered at such a rate that the cooling rate was 50° C./hr, while the atmospheric pressure in the chamber was kept to $10^{-5}$ Torr, by which the unidirectional solidification was conducted to obtain a solidified body.

Figure 31:
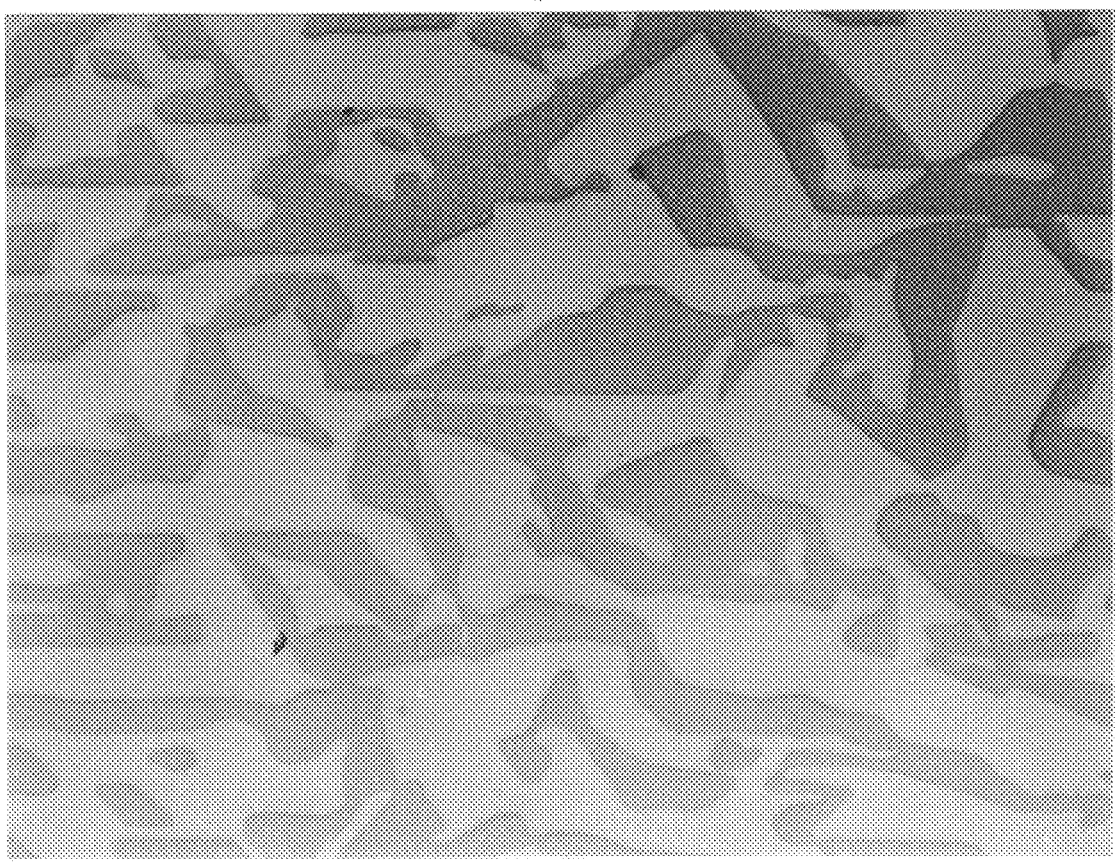
FIG. 31 is a SEM photograph showing the structure of the ceramic composite material in Example 10.

FIG. 31 is a SEM photograph of the microstructure in the cross-section perpendicular to the direction of solidification of the solidified body, in which the light portion is an $Er_3Al_5O_{12}$ phase and the dark portion is an α-$Al_2O_3$ phase. It was confirmed from FIG. 31 that the solidified body had a uniform structure having no colonies or grain boundaries and no pores or voids.

The X-ray diffraction of the cross-section of the solidified body perpendicular to the direction of solidification thereof was taken. As a result, only a diffraction peak from a certain plane of α-$Al_2O_3$ and a diffraction peak from a certain plane of $Er_3Al_5O_{12}$ were observed. It was therefore found that the solidified body was a ceramic composite material having a microstructure consisting of two phases of single crystal α-$Al_2O_3$ and single crystal $Er_3Al_5O_{12}$ which are three dimensionally continuous and intertwined with each other.

Figure 32A:
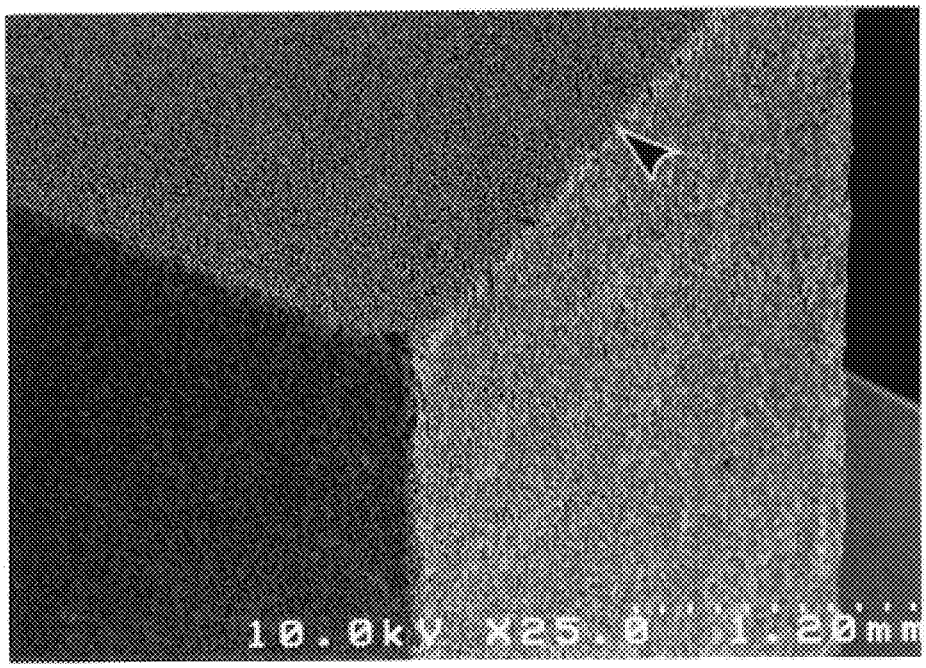
Figure 32B:
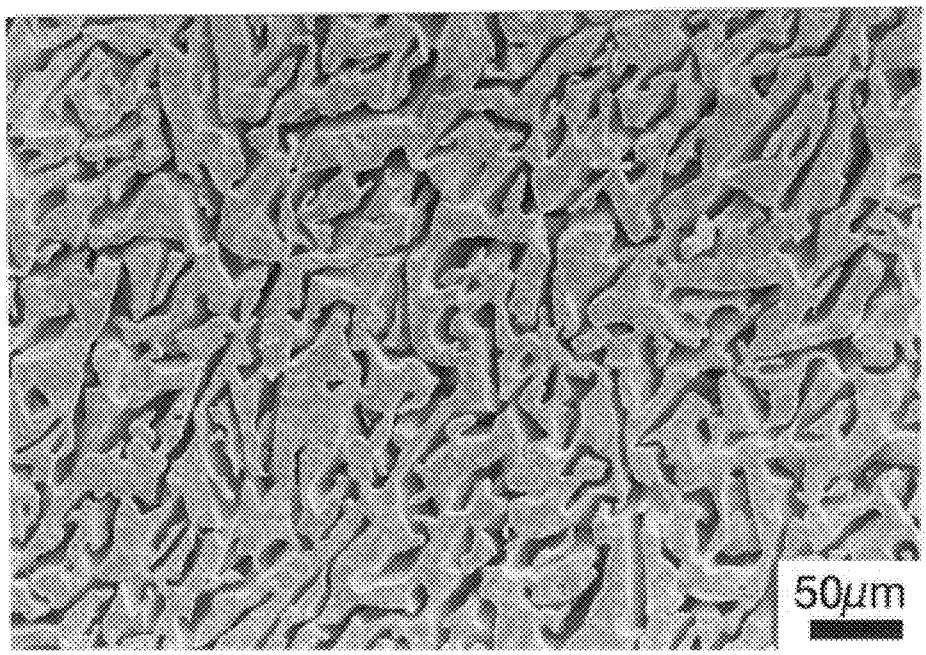

From the solidified body, only the α-$Al_2O_3$ phase was removed in the same manner as in Example 7. FIGS. 32A and 32B show SEM photographs of the thus obtained solidified body consisting only of the $Er_3Al_5O_{12}$ phase. FIG. 32A is a perspective view of a sample having a rectangular shape from a corner direction and FIG. 32B is an enlarged view of the portion indicated by the arrow in FIG. 32A. FIG. 32B clearly shows that the structure consisting of the $GdAlO_3$ phase and the pores intertwined with each other is a three dimensional structure.

From the above, it was confirmed that the solidified body was a ceramic composite material having a microstructure consisting of two phases of $\alpha$-$Al_2O_3$ single crystal and $Er_3Al_5O_{12}$ single crystal which were three dimensionally continuous and intertwined with each other, and, after removal of $\alpha$-$Al_2O_3$, was a porous single crystal $Er_3Al_5O_{12}$ ceramic material.

Table 12 shows the mechanical strength and porosity of this porous ceramic material. The mechanical strength shown in Table 12 is the value measured by the three point flexural test in argon at room temperature and at 1900° C. in air. The porous ceramic material of this Example had a high flexural strength of 165 MPa at 1900° C. even though it had a high porosity of 45%. Further, the porosity and the flexural strength of the material were not changed after heat treatment in air at 1800° C. for 100 hours.

Comparative Example 6

An $\alpha$-$Al_2O_3$ powder and a $Y_2O_3$ powder were mixed in a mol % ratio of 82.0/18.0 and were milled by wet ball milling in ethanol as a medium. The ethanol was removed from the formed slurry by a rotary evaporator.

The obtained mixed powder was charged in a graphite die and sintered, while pressing at a pressure of 500 kg/mm², at a temperature of 1700° C. and under an atmospheric pressure of $10^{-2}$ Torr for 2 hours.

By X-ray diffraction of the sintered body, diffraction peaks from a plurality of planes of $\alpha$-$Al_2O_3$ and diffraction peaks from a plurality of planes of YAG were observed and it was confirmed that the sintered body was a ceramic composite material consisting of an $\alpha$-$Al_2O_3$ polycrystal and a YAG polycrystal.

The sintered body was then immersed in an aqueous solution of nitric acid and fluoric acid in a weight % ratio of 1:5 for 20 hours to remove only the $\alpha$-$Al_2O_3$.

Table 11 shows the mechanical strength and porosity of the thus obtained porous sintered YAG material consisting only of the YAG phase. The mechanical strength shown in Table 11 is the value measured by the three point flexural test in air at room temperature. The mechanical strength is only 30 MPa. The flexural strength at 1900° C. could not be measured since the sample did not keep its shape at that temperature.

Comparative Example 7

An $\alpha$-$Al_2O_3$ powder and a $Er_2O_3$ powder were mixed in a mol % ratio of 81.1/18.9 and were milled by wet ball milling in ethanol as a medium. The ethanol was removed from the formed slurry by a rotary evaporator.

The obtained mixed powder was charged in a graphite die and sintered, while pressing at a pressure of 500kg/mm², at a temperature of 1700° C. and in an atmospheric pressure of $10^{-2}$ Torr for 2 hours.

By X-ray diffraction of the sintered body, diffraction peaks from a plurality of planes of $\alpha$-$Al_2O_3$ and diffraction peaks from a plurality of planes of $Er_3Al_5O_{12}$ were observed and it was confirmed that the sintered body was a ceramic composite material consisting of an $\alpha$-$Al_2O_3$ polycrystal and an $Er_3Al_5O_{12}$ polycrystal.

The sintered body was then immersed in an aqueous solution of nitric acid and fluoric acid in a weight % ratio of 1:5 for 20 hours to remove only the $\alpha$-$Al_2O_3$.

Table 11 shows the mechanical strength and porosity of the thus obtained porous sintered $Er_3Al_5O_{12}$ material consisting only of the $Er_3Al_5O_{12}$ phase. The mechanical strength shown in Table 11 is the value measured by the three point flexural test in air at room temperature. The mechanical strength is only 27 MPa. The flexural strength at 1900° C. could not be measured since the sample did not keep its shape at that temperature.

We claim:

1. A ceramic composite material consisting of two or more crystal phases of different components, each crystal phase having a non-regular shape, said crystal phases having three dimensional continuous structures intertwined with each other, at least one crystal phase thereof being a single crystal, wherein said ceramic composite material contains impurities in a total concentration of not more than 1000 ppm, and is free of colonies, pores and boundary phases, said crystal phases being oxides selected from the group consisting of metal oxides and complex oxides of two or more metals.

2. The ceramic composite material according to claim 1, wherein said ceramic composite material exhibits a plastic deformation of 0.5% or more after yielding in a flexural or tensile test.

3. The ceramic composite material according to claim 1, wherein said ceramic composite material has such a thermal stability that said crystal phases do not change even if said ceramic composite material is kept at a temperature of not more than 0.93 Tm where Tm stands for the melting point of said composite material.

4. The ceramic composite material according to claim 1, wherein all said crystal phases are single crystals.

5. The ceramic composite material according to claim 1, wherein said ceramic composite material is a solidified body obtained by unidirectional solidification.

6. The ceramic composite material according to claim 1, wherein said crystal phases constituting said ceramic composite material are selected from the group consisting of aluminum oxide ($Al_2O_3$) and rare earth element oxides ($La_2O_3$, $Y_2O_3$, $CeO_2$, $Pr_6O_{11}$, $Nd_2O_3$, $Sm_2O_3$, $Gd_2O_3$, $Eu_2O_3$, $Tb_4O_7$, $Dy_2O_3$, $Ho_2O_3$, $Er_2O_3$, $Tm_2O_3$, $Yb_2O_3$ and $Lu_2O_3$) and complex oxides formed from the aluminum oxide and the rare earth element oxide or oxides.

7. The ceramic composite material according to claim 6, wherein at least one of said oxides constituting said crystal phases is an oxide having a perovskite structure.

8. The ceramic composite material according to claim 6, wherein at least one of said oxides constituting said crystal phases is an oxide having a garnet structure.

9. A porous ceramic material consisting of at least one crystal phase and pores, said crystal phase and pores having non-regular shapes and being three dimensionally continuous and intertwined with each other, wherein said crystal phase constituting said porous ceramic material is free of colonies, pores and boundary phases, said crystal phase being an oxide selected from the group consisting of metal oxides and complex oxides of two or more metals.

10. The porous ceramic material according to claim 9, where said crystal phase constituting said porous ceramic material is a single crystal.

11. The porous ceramic material according to claim 9, where said porous ceramic material is produced by removing at least one crystal phase from a unidirectionally solidified body.

12. The porous ceramic material according to claim 9, wherein said crystal phase constituting said porous ceramic material is selected from the group consisting of aluminum oxide ($Al_2O_3$) and rare earth element oxides ($La_2O_3$, $Y_2O_3$, $CeO_2$, $Pr_6O_{11}$, $Nd_2O_3$, $Sm_2O_3$, $Gd_2O_3$, $Eu_2O_3$, $Tb_4O_7$, $Dy_2O_3$, $Ho_2O_3$, $Er_2O_3$, $Tm_2O_3$, $Yb_2O_3$ and $Lu_2O_3$) and complex oxides formed from the aluminum oxide and the rare earth element oxide or oxides.

13. The ceramic composite material according to claim 12, wherein said oxide constituting said crystal phase is an oxide having a perovskite structure.

14. The ceramic composite material according to claim 12, wherein said oxide constituting said crystal phase is an oxide having a garnet structure.

15. The ceramic composite material according to claim 1, wherein the metal constituting each of said oxides of said two or more crystal phases is a metal selected from the group consisting of Al, Mg, Si, Ti, Zr, Ca, Ba, Be, Cr and rare earth elements.

16. The porous ceramic material according to claim 9, wherein the metal constituting said oxide of said crystal phase is a metal selected from the group consisting of Al, Mg, Si, Ti, Zr, Ca, Ba, Be, Cr and rare earth elements.

* * * * *